US010319849B2

United States Patent

Ishimaru et al.

(10) Patent No.: US 10,319,849 B2
(45) Date of Patent: *Jun. 11, 2019

(54) SEMICONDUCTOR DEVICE, AND ALTERNATOR AND POWER CONVERSION DEVICE WHICH USE SAME

(71) Applicant: Hitachi Power Semiconductor Device, Ltd., Hitachi-shi, Ibaraki (JP)

(72) Inventors: Tetsuya Ishimaru, Tokyo (JP); Mutsuhiro Mori, Tokyo (JP); Junichi Sakano, Tokyo (JP); Kohhei Onda, Tokyo (JP)

(73) Assignee: Hitachi Power Semiconductor Device, Ltd., Hitachi-shi (JP)

( * ) Notice: Subject to any disclaimer, the term of this patent is extended or adjusted under 35 U.S.C. 154(b) by 397 days.

This patent is subject to a terminal disclaimer.

(21) Appl. No.: 15/102,771

(22) PCT Filed: Dec. 12, 2014

(86) PCT No.: PCT/JP2014/082947
§ 371 (c)(1),
(2) Date: Jun. 8, 2016

(87) PCT Pub. No.: WO2015/087997
PCT Pub. Date: Jun. 18, 2015

(65) Prior Publication Data
US 2016/0315184 A1 Oct. 27, 2016

(30) Foreign Application Priority Data

Dec. 12, 2013 (JP) .................................. 2013-256619

(51) Int. Cl.
*H01L 29/78* (2006.01)
*H01L 23/00* (2006.01)
(Continued)

(52) U.S. Cl.
CPC ........ *H01L 29/7808* (2013.01); *H01L 23/051* (2013.01); *H01L 23/3114* (2013.01);
(Continued)

(58) Field of Classification Search
CPC ... H01L 29/7808; H01L 23/367; H01L 24/92; H01L 25/072; H01L 23/544; H01L 24/37;
(Continued)

(56) References Cited

U.S. PATENT DOCUMENTS 5,381,038 A 1/1995 Ogimura et al.
5,859,478 A 1/1999 Hagi
(Continued)

FOREIGN PATENT DOCUMENTS

CN 101095231 A 12/2007
JP 10-215552 A 8/1998
(Continued)

OTHER PUBLICATIONS

International Search Report (PCT/ISA/210) issued in PCT Application No. PCT/JP2014/082947 dated Feb. 17, 2015 with English translation (three pages).

(Continued)

*Primary Examiner* — Jung Kim
(74) *Attorney, Agent, or Firm* — Crowell & Moring LLP

(57) ABSTRACT

The semiconductor device has a first external electrode having an outer peripheral section, which has a circular shape in top plan view and which is to be attached to an alternator. On the first external electrode there mounted: a MOSFET chip; a control circuitry to which voltages at or a current flowing between a first main terminal and a second main terminal of the MOSFET chip is inputted and which generates, on the basis of the voltages or the current, a control signal applied to a gate of the MOSFET chip; and a capacitor for providing a power supply to the control cir-
(Continued)

cuitry. The semiconductor device further has a second external electrode disposed opposite to the first external electrode with respect to the MOSFET chip. An electrical connection is made between the first main terminal of the MOSFET chip and the first external electrode, and between the second main terminal of the MOSFET chip and the second external electrode.

18 Claims, 18 Drawing Sheets

(51) Int. Cl.
*H01L 25/07* (2006.01)
*H02K 19/36* (2006.01)
*H02K 11/00* (2016.01)
*H02M 1/08* (2006.01)
*H02M 7/00* (2006.01)
*H02M 7/219* (2006.01)
*H02K 11/04* (2016.01)
*H01L 23/31* (2006.01)
*H01L 23/373* (2006.01)
*H02M 7/217* (2006.01)
*H02P 9/00* (2006.01)
*H01L 23/051* (2006.01)
*H01L 23/544* (2006.01)
*H01L 23/367* (2006.01)
*H02M 1/00* (2006.01)

(52) U.S. Cl.
CPC ........ *H01L 23/3142* (2013.01); *H01L 23/367* (2013.01); *H01L 23/373* (2013.01); *H01L 23/544* (2013.01); *H01L 24/01* (2013.01); *H01L 24/37* (2013.01); *H01L 24/40* (2013.01); *H01L 24/66* (2013.01); *H01L 24/69* (2013.01); *H01L 24/73* (2013.01); *H01L 24/75* (2013.01); *H01L 24/78* (2013.01); *H01L 24/92* (2013.01); *H01L 25/07* (2013.01); *H01L 25/072* (2013.01); *H01L 29/7805* (2013.01); *H02K 11/00* (2013.01); *H02K 11/046* (2013.01); *H02K 19/36* (2013.01); *H02M 1/08* (2013.01); *H02M 7/003* (2013.01); *H02M 7/217* (2013.01); *H02M 7/219* (2013.01); *H02P 9/00* (2013.01); *H01L 23/3107* (2013.01); *H01L 23/3135* (2013.01); *H01L 24/29* (2013.01); *H01L 24/32* (2013.01); *H01L 24/33* (2013.01); *H01L 24/45* (2013.01); *H01L 24/48* (2013.01); *H01L 24/49* (2013.01); *H01L 24/83* (2013.01); *H01L 24/84* (2013.01); *H01L 24/85* (2013.01); *H01L 2223/5442* (2013.01); *H01L 2223/54426* (2013.01); *H01L 2223/54486* (2013.01); *H01L 2224/04042* (2013.01); *H01L 2224/05554* (2013.01); *H01L 2224/0603* (2013.01); *H01L 2224/291* (2013.01); *H01L 2224/32245* (2013.01); *H01L 2224/33181* (2013.01); *H01L 2224/37012* (2013.01); *H01L 2224/37147* (2013.01); *H01L 2224/40137* (2013.01); *H01L 2224/40499* (2013.01); *H01L 2224/45147* (2013.01); *H01L 2224/48091* (2013.01); *H01L 2224/48137* (2013.01); *H01L 2224/48499* (2013.01); *H01L 2224/49175* (2013.01); *H01L 2224/73221* (2013.01); *H01L 2224/73265* (2013.01); *H01L 2224/75754* (2013.01); *H01L 2224/78753* (2013.01); *H01L 2224/78802* (2013.01); *H01L 2224/83101* (2013.01); *H01L 2224/83801* (2013.01); *H01L 2224/84801* (2013.01); *H01L 2224/9221* (2013.01); *H01L 2924/00011* (2013.01); *H01L 2924/13091* (2013.01); *H01L 2924/181* (2013.01); *H01L 2924/19107* (2013.01); *H02M 2001/0006* (2013.01)

(58) Field of Classification Search
CPC ......... H01L 24/78; H01L 24/69; H01L 24/73; H01L 23/3142; H01L 23/051; H01L 24/75; H01L 24/66; H01L 29/7805; H01L 23/373; H01L 23/3114; H01L 24/40; H01L 24/01; H01L 25/07; H01L 24/49; H01L 2224/49175; H01L 23/3135; H01L 23/3107; H01L 2224/78802; H01L 24/32; H01L 24/29; H01L 2224/83101; H01L 2224/40499; H01L 2223/54486; H01L 2223/54426; H01L 2223/5442; H01L 2224/83801; H01L 2224/9221; H01L 2224/48499; H01L 2924/19107; H01L 2224/78753; H01L 2224/37012; H01L 24/85; H01L 24/84; H01L 24/83; H01L 2224/75754; H01L 2224/84801; H01L 2224/291; H01L 2224/32245; H01L 2224/33181; H01L 24/48; H01L 24/45; H01L 2224/37147; H01L 2224/04042; H01L 2924/00011; H01L 2224/73221; H01L 2924/13091; H01L 2224/0603; H01L 2924/181; H01L 2224/73265; H01L 2224/05554; H01L 2224/48091; H01L 2224/40137; H01L 2224/45147; H01L 2224/48137; H01L 24/33; H02M 7/217; H02M 7/219; H02M 7/003; H02M 1/08; H02M 1/18; H02M 2001/0006; H02P 9/00; H02K 11/046; H02K 11/00; H02K 19/36
See application file for complete search history.

(56) References Cited

U.S. PATENT DOCUMENTS

| | | | |
|---|---|---|---|
| 5,886,403 A | | 3/1999 | Yoshinaga et al. |
| 6,476,480 B1 * | | 11/2002 | Staab .................... H01L 23/051 257/690 |
| 9,831,145 B2 * | | 11/2017 | Ishimaru ................ H01L 25/18 |
| 2002/0060502 A1 | | 5/2002 | Irie |
| 2004/0012275 A1 | | 1/2004 | Thery et al. |
| 2008/0290477 A1 | | 11/2008 | Muramatsu et al. |
| 2010/0244559 A1 | | 9/2010 | Goerlach et al. |

FOREIGN PATENT DOCUMENTS

| | | |
|---|---|---|
| JP | 2002-165429 A | 6/2002 |
| JP | 2003-33038 A | 1/2003 |
| JP | 2005-513760 A | 5/2005 |
| JP | 2011-507468 A | 3/2011 |
| JP | 2012-104757 A | 5/2012 |

OTHER PUBLICATIONS

Japanese-language Written Opinion (PCT/ISA/237) issued in PCT Application No. PCT/JP2014/082947 dated Feb. 17, 2015 (three pages).
Partial Supplementary European Search Report issued in counterpart European Application No. 14870416.6 dated Jul. 11, 2017 (26 pages).
Wang, "rack-mounted", Nov. 28, 2013, 10 pages, XP055387185.

* cited by examiner

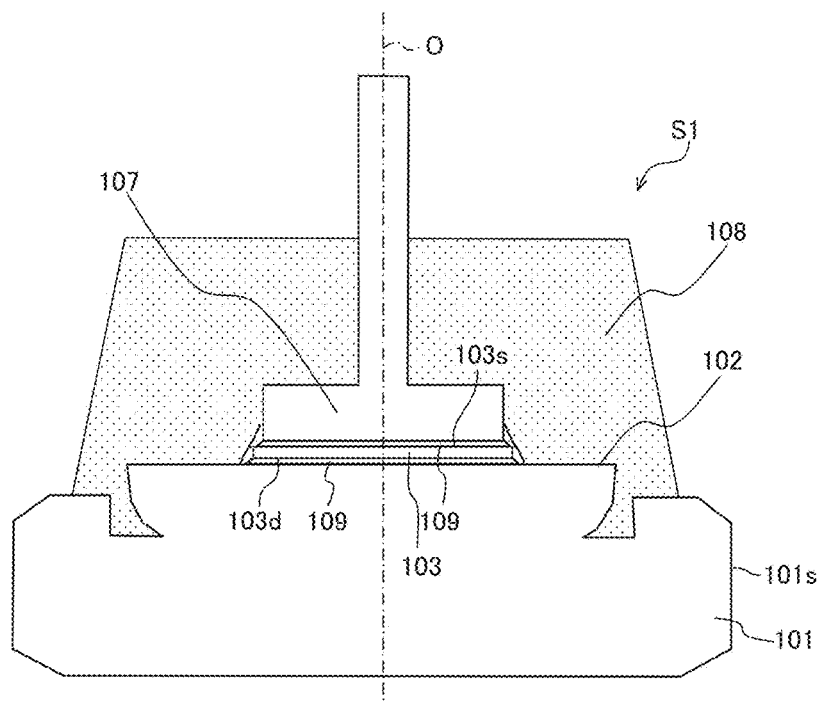
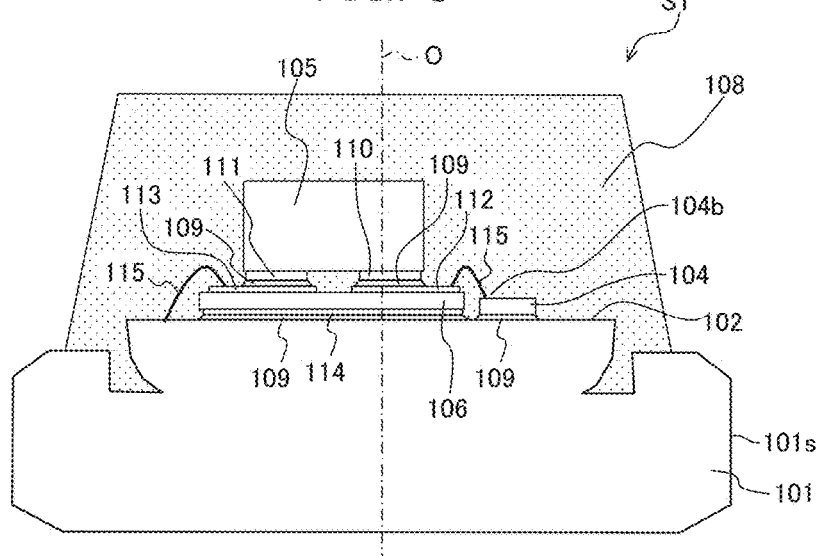

SEMICONDUCTOR DEVICE, AND ALTERNATOR AND POWER CONVERSION DEVICE WHICH USE SAME

TECHNICAL FIELD

The present invention relates to a semiconductor device, and an alternator and a power conversion device which use the semiconductor device.

BACKGROUND ART

Conventionally, in an electrical power generating alternator in an automotive vehicle, diodes are used as rectifiers which convert a generated alternating current to a direct current to charge a battery.

As disclosed in Patent Literature 1, a rectifier using a diode has: a lead electrode connected to a terminal on an upper surface of the diode; and a base electrode connected to a terminal on a lower surface of the diode. The package of the rectifier is composed of the base electrode and is fixed to an electrode plate of the alternator through solder or by press-in. For an alternator, as many as six or twelve rectifiers need to be fixed on the electrode plate of the alternator. Therefore it is important that the rectifiers be readily fixed to the alternator in assembly steps of the alternator.

A rectifier using a diode causes a large loss because a diode has a built-in potential as shown in FIG. 24.

In contrast, a rectifier using synchronous rectification by a metal oxide semiconductor field effect transistor (MOSFET) has a small loss because a MOSFET does not have a built-in potential so that a forward current rises from a voltage of 0 V. That is, since the same amount of current flows through a MOSFET by applying a lower voltage compared to a diode, the loss caused by a MOSFET is smaller than that of a diode. FIG. 24 shows forward current-voltage characteristics of a rectifier using MOSFET according to the present invention and forward current-voltage characteristics of a conventional diode rectifier using diode.

Patent literature 2 and patent literature 3 disclose MOSFET rectifiers for use in an alternator. In those MOSFET rectifiers, a MOSFET chip is mounted on a square package (see FIG. 3 of patent literature 2 and FIG. 7 of patent literature 3). A MOSFET has a pair of main terminals (source and drain terminals) and a gate terminal. In a wiring step of package assembly it is necessary to recognize the position of the gate terminal to which a wire is to be connected. If a MOSFET chip is mounted on a package having a square shape, it is easy to position the MOSFET chip in a rotational direction around a rotation axis of the package, thus steps for wiring are easy.

PRIOR ART DOCUMENT

Patent Literatures

Patent Literature 1: Japanese Unexamined Patent Application Publication No. 10-215552
Patent Literature 2: Japanese Unexamined Patent Application Publication No. 2003-33038 (FIG. 3)
Patent Literature 3: Japanese Unexamined Patent Application Publication (Translation of PCT Application) No. 2011-507468 (FIG. 7)

SUMMARY OF INVENTION

Problem to be Solved

When a MOSFET rectifier having a small loss is used in an alternator with a conventional MOSFET package having a square shape, it is necessary to position the MOSFET package (rectifier) in a rotational direction around a rotation axis of the MOSFET package, in order to fix the MOSFET rectifier in the hole provided in the alternator by press-in when fixing the rectifier to the alternator.

This makes it difficult to fix a large number of rectifiers to alternators in a simplified manner.

In particular, when employing a fixing method by means of press-in, which is a recent mainstream fixing method for diode rectifiers, the package having a square shape is difficult to fix because it necessitates precise positioning in a rotational direction around a rotation axis of the package. Moreover, the use of a MOSFET package having a square shape necessitates preparation of a special alternator to which the square MOSFET package is pressed-in to be fixed, resulting in an increase in development costs and manufacturing costs, and sacrificing versatility.

That is, since the shape of a diode rectifier and the shape of a rectifier using a square MOSFET package are different, they need to be separately developed and manufactured. Moreover, an assembly apparatus for fixing a diode rectifier to an alternator by means of press-in cannot be used for such a rectifier using a square MOSFET package. Thus, it is necessary to prepare and use a separate assembly apparatus for fixing the square MOSFET package to the alternator.

The present invention has been devised in consideration of the foregoing problems, and it is an object of the present invention to provide a semiconductor device which has a small loss and which is assembled in a simple manner, and to provide an alternator and a power supply device which use the semiconductor device.

Solution to Problem

To achieve the above object, a first aspect of the present invention provides a semiconductor device having: a first external electrode to be attached to an alternator, the first external electrode having an outer peripheral section, which has a circular shape in top plan view; a MOSFET chip having a drain electrode, a source electrode, and a gate; a second external electrode disposed on one side of the MOSFET chip, on the other side of which the first external electrode is disposed; and a control circuitry to which a voltage at the drain electrode and a voltage at the source electrode are inputted or a current flowing between the drain electrode and the source electrode is inputted and which generates a control signal provided to the gate on the basis of the voltages or the current. In the above semiconductor device, the first external electrode, the drain electrode of the MOSFET chip, the source electrode of the MOSFET chip, and the second external electrode are disposed so as to be stacked one over another, wherein one of the drain electrode and the source electrode of the MOSFET chip is electrically connected to the first external electrode, and wherein the other one of the drain electrode and the source electrode of the MOSFET chip is electrically connected to the second external electrode.

Specifically, for example, the above semiconductor device according to the first aspect of the present invention may further have a capacitor that supplies electric power to the control circuitry. In this semiconductor device, the MOSFET chip, the control circuitry, and the capacitor are mounted on the first external electrode; the first external electrode, the drain electrode of the MOSFET chip, the source electrode of the MOSFET chip, and the second external electrode are disposed so as to be stacked in this order in an upward direction; the drain electrode of the MOSFET chip and the first external electrode are electrically connected with each other; and the source electrode of the MOSFET chip and the second external electrode are electrically connected with each other.

Alternatively, for example, the above semiconductor device according to the first aspect of the present invention may further have a capacitor that supplies electric power to the control circuitry. In this semiconductor device, the second external electrode has a pedestal having an extent within the circular outer peripheral section of the first external electrode; the MOSFET chip, the control circuitry, and the capacitor are mounted on the pedestal of the second external electrode; the second external electrode, the drain electrode of the MOSFET chip, the source electrode of the MOSFET chip, and the first external electrode are disposed so as to be stacked in this order in an upward direction; the drain electrode of the MOSFET chip and the second external electrode are electrically connected with each other; and the source electrode of the MOSFET chip and the first external electrode are electrically connected with each other.

An aspect of the present invention provides an alternator having a semiconductor device according to the present invention.

An aspect of the present invention provides a power conversion device having a semiconductor device according to the present invention.

Advantageous Effect of Invention

The present invention provides a semiconductor device which has a small loss and which is assembled in a simple manner, and provides an alternator and a power conversion device which use the semiconductor device.

BRIEF DESCRIPTION OF DRAWINGS

FIG. 2 is a cross-section taken along line I-I in FIG. 1.

FIG. 3 is a cross-section taken along line II-II in FIG. 1.

DESCRIPTION OF EMBODIMENTS

Embodiments of the present invention will now be described below in detail with reference to the drawings. In the figures for illustrating the embodiments, the same symbol will be assigned to each element that has the same function in respective figures, and overlapping description will be omitted as appropriate.

First Embodiment

Reference is now made to FIGS. 1 through 4 to illustrate the structure of a synchronous rectification MOSFET rectifier S1 according to a first embodiment of the invention.

Figure 1:
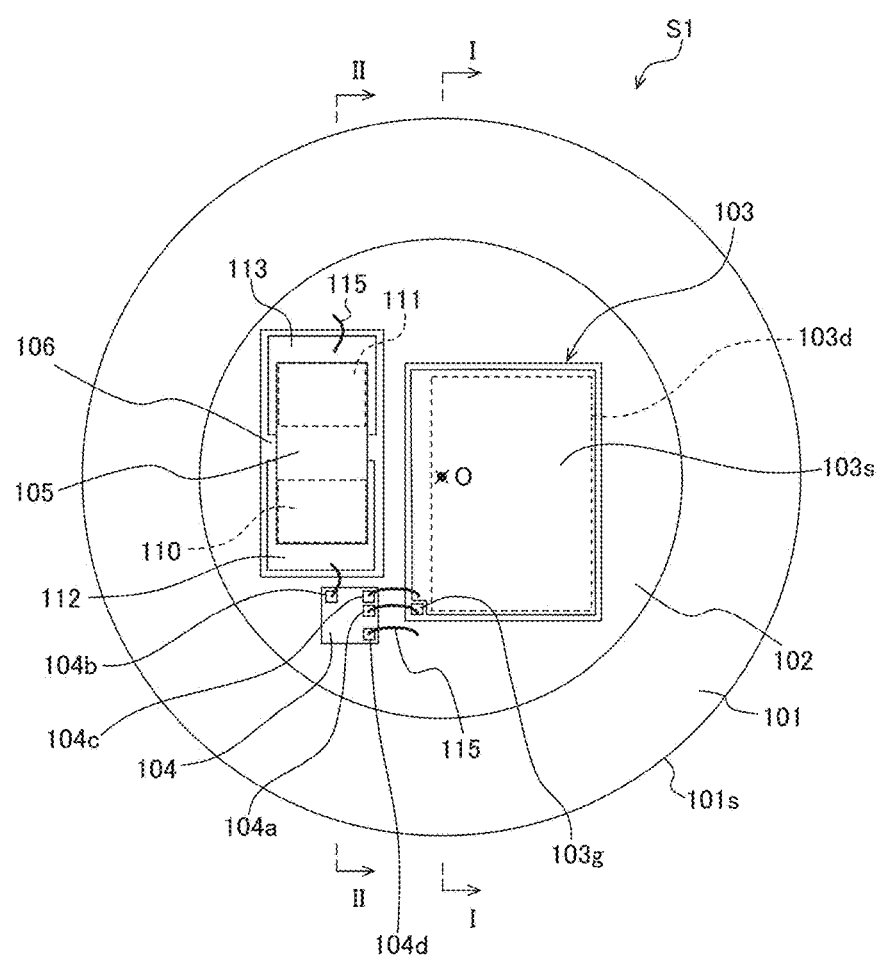
FIG. 1 is a top view of a synchronous rectification MOSFET rectifier according to a first embodiment of the invention, omitting illustration of part of the package of the rectifier.

FIG. 1 is a top view of a synchronous rectification MOSFET rectifier according to the first embodiment of the invention, omitting illustration of part of the package of the rectifier. In FIG. 1, illustration of a lead electrode 107 (see FIG. 2) and resin 108, which are arranged on an upper portion of the package of the rectifier S1, are omitted to facilitate understanding.

FIG. 2 is a cross-section taken along line I-I in FIG. 1.
FIG. 3 is a cross-section taken along line II-II in FIG. 1.
<Configuration of Rectifier S1>
First, the constituent elements of the synchronous rectification MOSFET rectifier S1 according to the first embodiment will be described below.

As shown in FIG. 1, the rectifier S1 has: a base electrode 101 having an outer peripheral section 101s, which has a circular shape in top plan view; a pedestal 102 provided in an upper portion of the base electrode 101; a MOSFET chip 103, a control circuit chip 104, and a capacitor 105, which are mounted on the pedestal 102; and a lead electrode 107 (see FIG. 2) put on the MOSFET chip 103.

As shown in FIG. 3, below the capacitor 105, an isolation substrate 106 having electrodes (112, 113) is laid on the pedestal 102 of the base electrode 101. The pedestal 102 and the electronic components (103, 104, 105) are encapsulated with resin 108.

As shown in FIG. 1, the MOSFET chip 103 has a square shape in top plan view. The capacitor 105 and the control circuit chip 104 each having a rectangular shape are arranged alongside and adjacent to a longitudinal side of the MOSFET chip 103. With this arrangement, the MOSFET chip 103, the capacitor 105, and the control circuit chip 104 are arranged close to one another to have a narrow gap with one another. Therefore, the MOSFET chip 103, the capacitor 105, and the control circuit chip 104 are arranged with high mounting efficiency.

In addition, they are arranged in such a manner as to allow the shortest possible length of the paths making electrical connections among first to fourth electrodes 104a to 104d of the control circuit chip 104, the MOSFET chip 103, and the capacitor 105.

This makes it possible to have the shortest possible lengths of wires 115 making electrical connections among the control circuit chip 104, the MOSFET chip 103, and the capacitor 105, thereby to achieve high reliability of the electrical connections. Therefore, only a small amount of wire 115 is required, resulting in ease of assembly and a low cost.

<Connection of MOSFET Chip 103>

Next, connection of the MOSFET chip 103 will be described below.

As shown in FIG. 2, the MOSFET chip 103 has a lower surface on which a drain electrode 103d is provided. The drain electrode 103d is fixed to the pedestal 102 of the base electrode 101 by solder 109, which electrically and thermally connects the MOSFET chip 103 to the base electrode 101.

Here, "thermally" means that, since an extended surface of the drain electrode 103d of the MOSFET chip 103 is coupled and fixed through the solder 109 to an upper surface (extended surface) of the pedestal 102 of the base electrode 101, the heat transfer area between the MOSFET chip 103 and the base electrode 101 is so large that the heat of the MOSFET chip 103 is effectively transferred to the base electrode 101 and dissipated.

The MOSFET chip 103 has an upper surface on which a source electrode 103s is provided. The source electrode 103s is fixed through solder 109 to the lead electrode 107, which electrically and thermally connects the MOSFET chip 103 to the lead electrode 107.

Here, "thermally" means that, since an extended surface of the source electrode 103s of the MOSFET chip 103 is coupled and fixed through the solder 109 to a lower surface (extended surface) of the lead electrode 107, the heat transfer area between the MOSFET chip 103 and the source electrode 103s is so large that the heat of the MOSFET chip 103 is effectively transferred to the source electrode 103s and dissipated.

As shown in FIG. 1, a gate electrode 103g on the upper surface of the MOSFET chip 103 is electrically connected to a first electrode 104a provided on an upper surface of the control circuit chip 104 by wire-bonding with a wire 115.

The gate electrode 103g of the MOSFET chip 103 is arranged at a corner portion of the MOSFET chip 103 which corner portion is near the control circuit chip 104. This makes it possible, as described, to have the shortest possible distance between the gate electrode 103g of the MOSFET chip 103 and the first electrode 104a of the control circuit chip 104, and thus to have the shortest possible length of the wire 115. This ensures reliable wire-bonding with the wire 115 and achieves high reliability of connection.

<Connection of Capacitor 105>

Next, connection of the capacitor 105 will be described below.

As shown in FIG. 3, the capacitor 105 is fixed through the isolation substrate 106 to the pedestal 102 of the base electrode 101 by solder 109. As to electrical connection, a high-voltage-side terminal 110 of the capacitor 105 is connected to a first electrode 112 provided on an upper surface of the isolation substrate 106 by solder 109, and the first electrode 112 of the isolation substrate 106 is connected to a second electrode 104b provided on an upper surface of the control circuit chip 104 by wire-bonding with a wire 115.

As shown in FIG. 1, the high-voltage-side terminal 110 of the capacitor 105 and the second electrode 104b of the control circuit chip 104 are arranged so that the high-voltage-side terminal 110 of the capacitor 105 and the second electrode 104b of the control circuit chip 104 are connected with each other via a wire 115 with the shortest possible length. This increases the mounting efficiency of the control circuit chip 104 and the capacitor 105, and achieves high wire-bonding reliability.

Similarly, as to electrical connection, a low-voltage-side terminal 111 of the capacitor 105 is connected to a second electrode 113 provided on the upper surface of the isolation substrate 106 by solder 109, and the second electrode 113 of the isolation substrate 106 is connected to the pedestal 102 of the base electrode 101 by wire-bonding with a wire 115.

<Connection of Control Circuit Chip 104>

Next, connection of the control circuit chip 104 will be described below.

As described above, the first electrode 104a provided on the upper surface of the control circuit chip 104 is electrically connected to the gate electrode 103g provided on the upper surface of the MOSFET chip 103 by wire-bonding with a wire 115. The second electrode 104b provided on the upper surface of the control circuit chip 104 is electrically connected to the first electrode 112 on the upper surface of the isolation substrate 106, which is connected to the high-voltage-side terminal 110 of the capacitor 105, by wire-bonding with a wire 115.

Further, as shown in FIG. 1, a third electrode 104c provided on the upper surface of the control circuit chip 104 is electrically connected to the source electrode 103s, which constitutes the upper surface of the MOSFET chip 103, by wire-bonding with a wire 115.

A fourth electrode 104d provided on the upper surface of the control circuit chip 104 is electrically connected to the pedestal 102 of the base electrode 101 by wire-bonding with a wire 115.

The above described wiring with the wires 115 establishes: an electrical connection between the MOSFET chip 103 and the control circuit chip 104; an electrical connection between the control circuit chip 104 and the capacitor 105; and an electrical connection among the control circuit chip 104, the capacitor 105, and the base electrode 101.

The configuration described above provides a forward-side rectifier S1.

<Circuit Configuration of Rectifier S1>

Subsequently, the circuit configuration of the rectifier S1 will be described.

Figure 4:
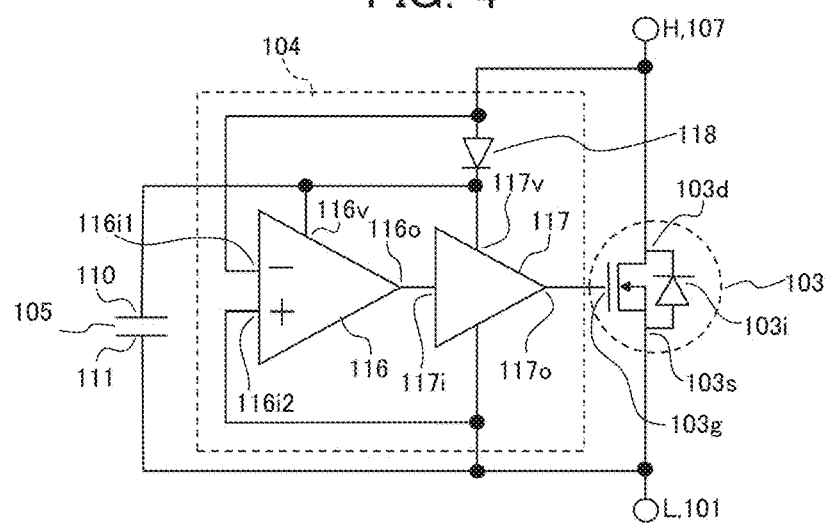
FIG. 4 is a circuit diagram of a synchronous rectification MOSFET rectifier according to the first embodiment.

FIG. 4 is a circuit diagram of the synchronous rectification MOSFET rectifier according to the first embodiment.

In the circuit shown in FIG. 4, an L terminal represents the base electrode 101; and an H terminal represents the lead electrode 107. The above described electrical connections among the MOSFET chip 103, the control circuit chip 104, and the capacitor 105, which have been described with reference to FIGS. 1 to 3, are shown in the circuit diagram.

The MOSFET chip 103 includes a diode 103*i* in parallel with a MOSFET. The control circuit chip 104 is constituted by: a comparator 116, which compares the voltage at the L terminal with the voltage at the H terminal; a gate driver 117 applying a voltage to the gate electrode 103*g*; and a backflow prevention diode 118.

A first input terminal 116*i*1 of the comparator 116, which is one of the input terminals of the comparator 116, is connected to the H terminal (lead electrode 107). A second input terminal 116*i*2 of the comparator 116, which is the other one of the input terminals of the comparator 116, is connected to the L terminal (base electrode 101). An output terminal 116*o* of the comparator 116 is connected to an input terminal 117*i* of the gate driver 117. An output terminal 117*o* of the gate driver 117 is connected to the gate electrode 103*g* of the MOSFET chip 103.

The high-voltage-side terminal 110 of the capacitor 105 is connected to the power supply terminal 116*v* of the comparator 116 and to the power supply terminal 117*v* of the gate driver 117. The low-voltage-side terminal 111 of the capacitor 105 is connected to the L terminal. In addition, the backflow prevention diode 118 for preventing backflow of charges of the capacitor 105 is connected between the capacitor 105 and the H terminal.

<Operation of Rectifier S1>

The circuit of the rectifier S1 illustrated in FIG. 4 operates as follows.

When the voltage at the H terminal (lead electrode 107) becomes lower than that at the L terminal (base electrode 101), the comparator 116 outputs a high (or low) voltage signal to the gate driver 117. The gate driver 117, to which the high (or low) voltage signal has been inputted, raises the voltage of the gate electrode 103*g* of the MOSFET chip 103 to turn the MOSFET chip 103 to an ON state.

Conversely when the voltage at the H terminal (lead electrode 107) becomes higher than that at the L terminal (base electrode 101), the comparator 116 outputs a low (or high) voltage signal to the gate driver 117. The gate driver 117, to which the low (or high) voltage signal has been inputted, lowers the voltage of the gate electrode 103*g* of the MOSFET chip 103 to turn the MOSFET chip 103 to an OFF state.

That is, the comparator 116 compares voltages at the H terminal (lead electrode 107) and the L terminal (base electrode 101) in terms of magnitude, and based on the comparison result the gate driver 117 turns on or off the MOSFET chip 103. The capacitor 105 supplies, by the charges stored therein, a power supply voltage to the comparator 116 and the gate driver 117 through the power supply terminals 116*v* and 117*v*, respectively.

It is to be noted that the control circuitry illustrated in FIG. 4 is just an example of the control circuitry for embodying the rectifier S1 according to the present invention, and that the present invention is not limited thereto. For example, a differential amplifier, which detects and amplifies a difference between input signals, can be substituted for the comparator 116; or the MOSFET chip 103 can be turned on or off based on the direction of the current flowing through the MOSFET chip 103.

Moreover, an external power supply can be substituted for the capacitor 105 shown in FIG. 4.

<Features and the Effects of Rectifier S1>

Next, a description will be given of features and effects of the synchronous rectification MOSFET rectifier S1 according to the first embodiment described with reference to FIGS. 1 to 4.

Figure 5:
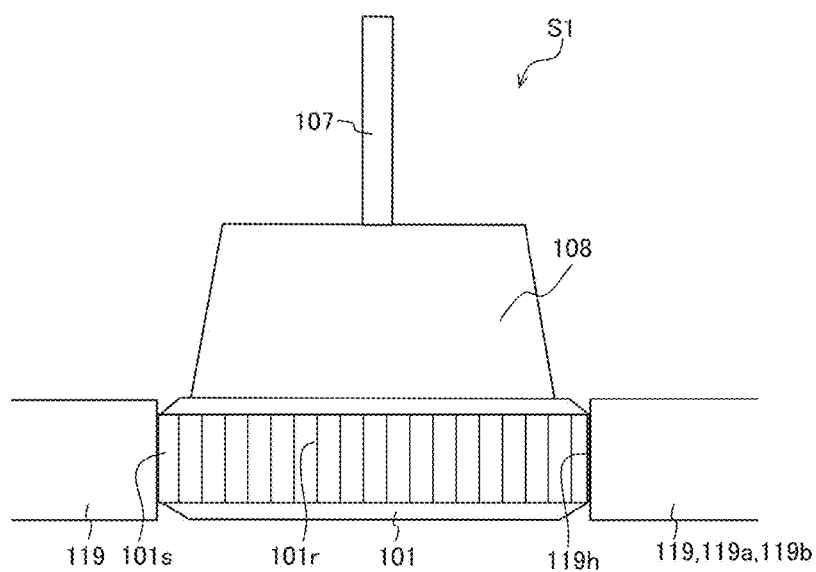
FIG. 5 is a side view of a press-in type synchronous rectification MOSFET rectifier according to the first embodiment, which is fixed to a heat dissipation plate of an alternator.

FIG. 5 is a side view of a press-in type synchronous rectification MOSFET rectifier according to the first embodiment, which synchronous rectification MOSFET rectifier is fixed to a heat dissipation plate of an alternator.

Figure 22:
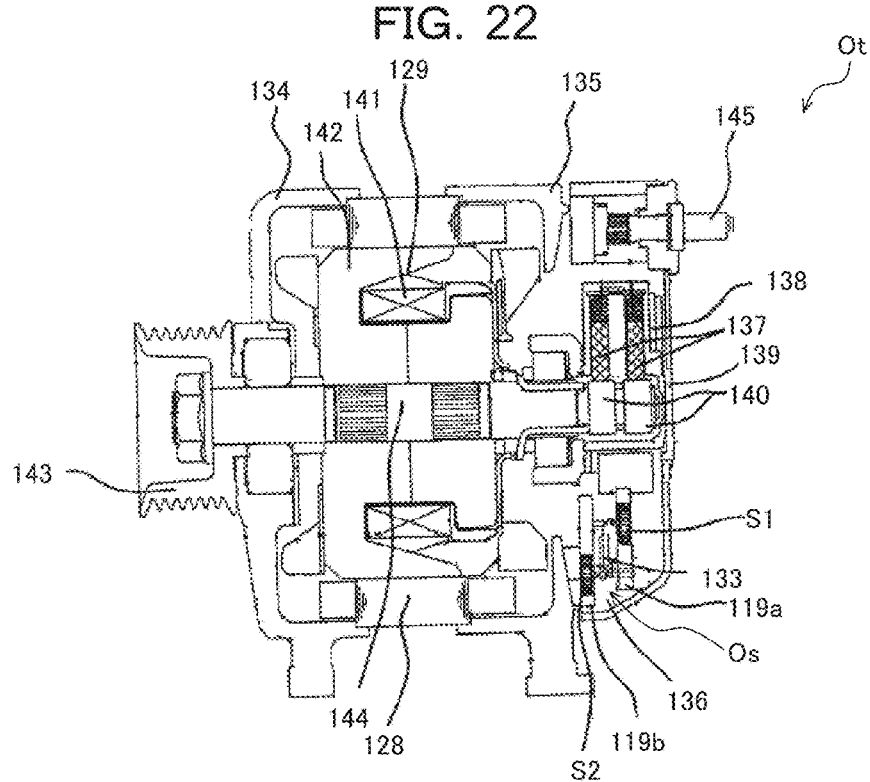
FIG. 22 is a cross-section of a substantial part of an alternator in which synchronous rectification MOSFET rectifiers are employed.

As shown in FIG. 5, the rectifier S1 using the MOSFET chip 103 is fixed to a heat dissipation plate 119 of an alternator Ot by pressing-in or soldering the base electrode 101 to an attachment hole 119*h* of the heat dissipation plate 119 (see FIG. 22).

When the rectifier S1 is to be fixed by press-in, as shown in FIG. 5, the base electrode 101 is provided with an outer peripheral section 101*s* on which a knurling 101*r* having alternating projections and recesses in top plan view is formed (the alternating projections and recesses are formed in a circumferential direction of the outer peripheral section 101*s* such that the alternating projections and recesses respectively have a height and a depth in a radial direction).

On the other hand, when the rectifier S1 is to be fixed by soldering, the knurling 101*r* need not be formed on the outer peripheral section 101*s* of the base electrode 101. Instead, a solder sheet is placed on the inner wall of an attachment hole 119*h* formed on the heat dissipation plate 119 of the alternator. Then, the base electrode 101 of the rectifier S1 is fitted into the attachment hole 119*h* of the heat dissipation plate 119 to be press-fitted to the solder sheet placed on the inner wall of the attachment hole 119*h*. The solder sheet is then melted in a soldering furnace to fix the base electrode 101 of the rectifier S1 via solder into the attachment hole 119*h* of the heat dissipation plate 119.

The MOSFET chip 103 is mounted on the base electrode 101 of the rectifier S1 having the circular outer peripheral section 101*s*, and, in the fixing operation, the center of the circular outer peripheral portion 101*s* of the base electrode 101 of the rectifier S1 (center axis O) is aligned with the center of the hole 119*h* of the heat dissipation plate 119 of the alternator. This makes it possible to readily fix the rectifier S1, which uses the MOSFET chip 103, into the attachment hole 119*h* of the heat dissipation plate 119 of the alternator Ot, without positioning the package of the rectifier S1 in a rotational direction around a rotation axis of the package (center axis O of the circular outer peripheral section 101*s* of the base electrode 101 shown in FIG. 1).

That is, the base electrode 101 of the rectifier S1 is pressed-in and fixed to the circular attachment hole 119*h*, which is provided on the heat dissipation plate 119 and whose diameter is smaller than the diameter of the outer peripheral section 101*s* of the base electrode 101. In the case of such a press-in type rectifier S1, it is possible to align the center of the circular outer peripheral section 101*s* of the base electrode 101 (center axis O) with the center of the hole 119*h* by virtue of the base electrode 101 having the circular outer peripheral section 101*s*, and thus there is no need of positioning the rectifier S1 in a rotational direction around the rotation axis (center axis O). That is, there is no need of precise positioning of the outer peripheral section 101*s* of the base electrode 101 with the attachment hole 119*h* provided on the heat dissipation plate 119, thus simplifying the fixing operation of the rectifier S1 to the heat dissipation plate 119.

Many rectifiers S1 using MOSFET chips 103 need to be attached to the heat dissipation plate 119 of the alternator Ot. Since the rectifiers S1 using MOSFET chips 103 are readily fixed to the alternator Ot, the manufacturing process for the alternator Ot is simplified and thus low-cost manufacturing is achieved.

Figure 6:
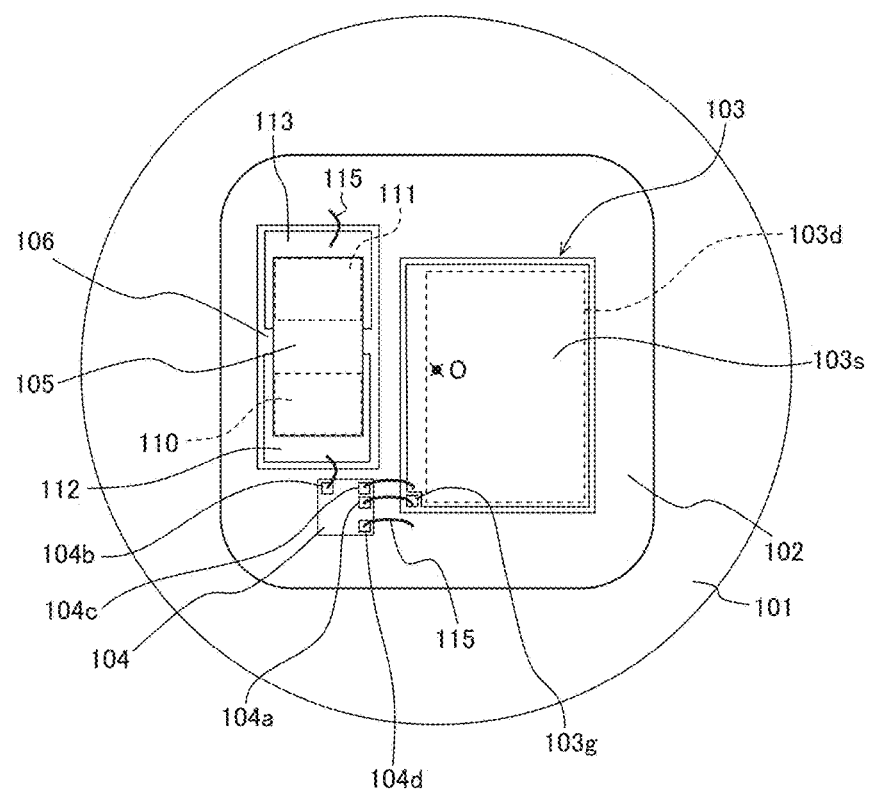
FIG. 6 is a top view of another embodiment of the MOSFET rectifier according to the first embodiment.

The pedestal 102 of the base electrode 101 of the embodiment shown in FIG. 1 has a circular shape. The pedestal 102 may have a square shape instead of the circular shape, as shown in FIG. 6. FIG. 6 is a top view of another embodiment of the MOSFET rectifier according to the first embodiment.

When the pedestal 102 is made to have a circular shape in top plan view, the end section of the pedestal surface is uniformly formed. This improves reliability of the thermal fatigue resistance measured in a thermal fatigue test and reliability of the temperature resistance characteristics measured in a temperature cycling test.

Meanwhile, when the pedestal 102 is made to have a square shape in top plan view, that shape suits the shapes of the MOSFET chip 103, the capacitor 105, and the control circuit chip 104, which are each rectangular. This makes it possible to mount the electronic components (103, 104, 105) on the pedestal with high area efficiency. This means that a MOSFET chip 103 having a larger shape and/or a capacitor 105 having a larger shape can be mounted than when the pedestal 102 has a circular shape in top plan view.

In this case, the pedestal 102 having a square shape in top plan view may have four corners each having a curvature to have gradual change in shape, suppressing degradation in reliability of the thermal fatigue resistance measured in a thermal fatigue test and the temperature resistance characteristics measured in a temperature cycling test.

It is preferable that the MOSFET chip 103 have, when viewed in top plan, a rectangular shape rather than a square shape, and that the capacitor 105 and the control circuit chip 104 are arranged alongside and adjacent to a longitudinal side of the rectangular shape. This configuration makes it possible to mount the electronic components (103, 104, 105) on the pedestal 102 with high area efficiency, thus a MOSFET chip 103 and/or a capacitor 105 each having larger dimensions can be used.

The MOSFET chip 103 is located on the center axis O (rotation axis) of the base electrode 101 and the pedestal 102 when viewed in top plan. The terminal of the lead electrode 107 (see FIG. 2), which is connected to the upper surface of the MOSFET chip 103, is also located on the center axis O of the base electrode 101 and the pedestal 102. This configuration makes it possible to use synchronous rectification MOSFET rectifiers S1 according to the present invention with an alternator that uses conventional diode rectifiers, and to connect the lead electrodes 107 of the rectifiers S1 to the alternator.

In addition, by arranging the terminal of the lead electrode 107 of a rectifier S1 on the center axis O of the package of the rectifier S1 when viewed in top plan, symmetry of the lead electrode 107 with respect to the package is provided, improving resistance (stiffness) against a bending force applied to the lead electrode 107.

Further, arrangement of the terminal of the lead electrode 107 on the center axis O of the package of a rectifier S1 in top plan view eliminates the need for positioning the MOSFET chip 10 in a rotational direction around the rotation axis (center axis O) in top plan view. That is, center alignment of the package of the rectifier S1 establishes positioning of the rectifier S1.

As described above, the source electrode 103s of the MOSFET chip 103 is electrically connected to (the extended surface of) the lead electrode 107 not by a wire but rather by the solder 109 applied to the surface of the source electrode 103s; and the drain electrode 103d of the MOSFET chip 103 is electrically connected to (the extended surface of) the base electrode 101 not by wiring but rather by the solder 109 applied to the surface of the drain electrode 103d. This structure dissipates the heat generated in the MOSFET chip 103 during rectification through the solder 109 to the base electrode 101 and to the lead electrode 107, with large heat transfer areas. This suppresses an increase in the temperature of the MOSFET chip 103.

Due to a gate oxide film included in a MOSFET chip 103, it is more difficult to ensure reliability of the MOSFET chip 103 at high temperatures compared to a diode chip. Moreover, a MOSFET chip 103 has a greater ON voltage at high temperatures because the carrier mobility of the MOSFET chip 103 decreases as temperature increases, and thus has a great loss on the contrary to a diode. Therefore, heat dissipation is in particular important for the MOSFET chip 103. Good heat dissipation from the upper and lower surfaces (source electrode 103s and drain electrode 103d) of the MOSFET chip 103 is effective for power savings.

As shown in FIG. 1, the gate electrode 103g on the upper surface of the MOSFET chip 103 is arranged at the corner or side of the upper surface which is nearest to the first electrode 104a of the control circuit chip 104. This arrangement shortens the length of the wire 115 electrically connecting the MOSFET chip 103 and the first electrode 104a of the control circuit chip 104 with each other, and thus improves reliability of the thermal fatigue measured in a thermal fatigue test on the wiring and reliability of the thermal deterioration measured in a temperature cycling test on the wiring.

The capacitor 105 is mounted on the isolation substrate 106 mounted on the pedestal 102 of the base electrode 101, to fix the capacitor 105 to the base electrode 101. The capacitor 105, which is in a rectangular shape, is arranged so that a longitudinal side of the capacitor 105 is in parallel with a longitudinal side of the MOSFET chip 103, which is in a rectangular shape.

With regard to the orientation of the capacitor 105, the capacitor 105 is arranged so that the high-voltage-side terminal 110 of the capacitor 105 is located in the vicinity of the control circuit chip 104 and the low-voltage-side terminal 111 of the capacitor 105 is located far from the control circuit chip 104. This arrangement improves the area efficiency of the electronic components. This arrangement shortens the length of the wiring and thus improves reliability of the thermal fatigue measured in a thermal fatigue test on the wiring and reliability of the thermal deterioration measured in a temperature cycling test on the wiring.

Examples of the insulating material for the isolation substrate 106 include isolating resin, alumina, and aluminum nitride. Those insulating materials each have a thermal conductivity lower than 400 $Wm^{-1}K^{-1}$, the thermal conductivity of Cu, which is the material of the base electrode 101. Isolating resin has a thermal conductivity of from 0.3 to 3 $Wm^{-1}K^{-1}$; alumina, from 20 to 30 $Wm^{-1}K^{-1}$; and aluminum nitride, approximately 200 $Wm^{-1}K^{-1}$.

An isolation substrate 106 having a thermal conductivity lower than that of the base electrode 101 is interposed between the base electrode 101 and the capacitor 105. This structure suppresses the heat generated in the MOSFET chip 103 during rectification operation from being transferred to the capacitor 105, and thus suppresses degradation in reliability of the capacitor 105 due to being heated to a high temperature.

In the embodiment shown in FIGS. 1 to 3, the isolation substrate 106 having a low thermal conductivity is placed under both the high-voltage-side terminal 110 and the lowvoltage-side terminal 111 of the capacitor 105. This structure reduces the thermal conduction to the capacitor 105 and sufficiently suppresses the heat generated by the MOSFET chip 103 from being transferred to the capacitor 105. In addition, that structure makes it easy to level heights of the high-voltage-side terminal 110 and the low-voltage-side terminal 111.

<Rectifier S11 of Variant Embodiment 1>

Figure 7:
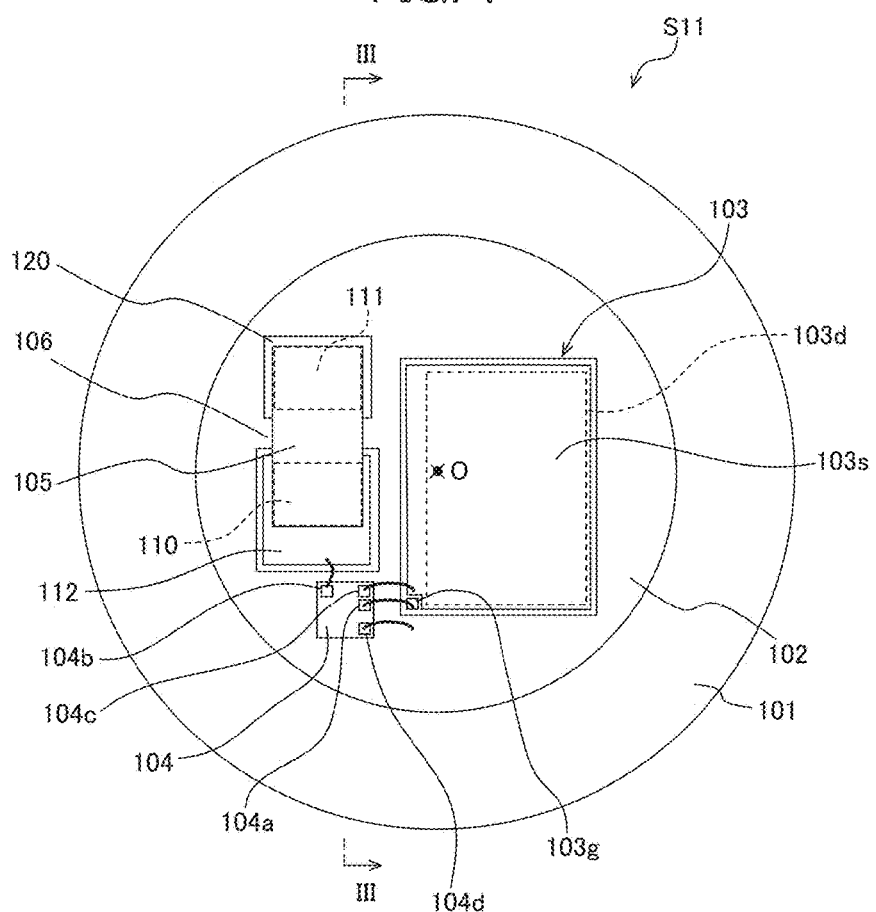
FIG. 7 is a top view of another embodiment (variant embodiment 1) of the MOSFET rectifier according to the first embodiment.

FIG. 7 is a top view of another embodiment (variant embodiment 1) of the MOSFET rectifier according to the first embodiment. In FIG. 7, illustration of the lead electrode 107, resin 108, and the like, which are put on the MOSFET chip 103, are omitted.

Figure 8:
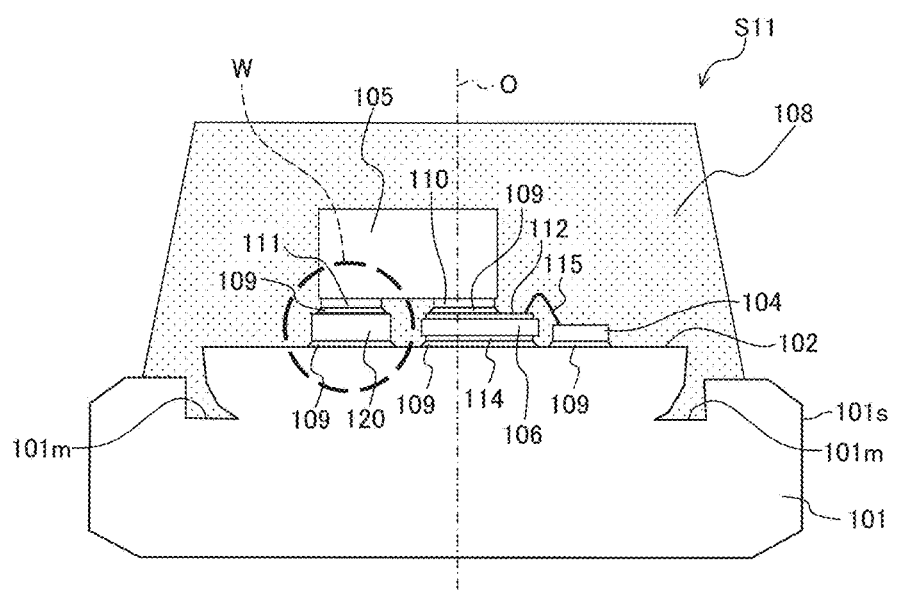
FIG. 8 is a cross-section taken along line III-III in FIG. 7.

As shown in the top view in FIG. 7 and shown in FIG. 8, which is a cross-section taken along line IIII-III in FIG. 7, the isolation substrate 106 may be placed only under the high-voltage-side terminal 110 of the capacitor 105, and a metal plate 120 or the like may be placed under the low-voltage-side terminal 111 of the capacitor 105 to electrically connect the base electrode 101 and the low-voltage-side terminal 111 of the capacitor 105 with each other. This structure reduces the area required to connect the base electrode 101 with the low-voltage-side terminal 111 of the capacitor 105.

Figure 9:
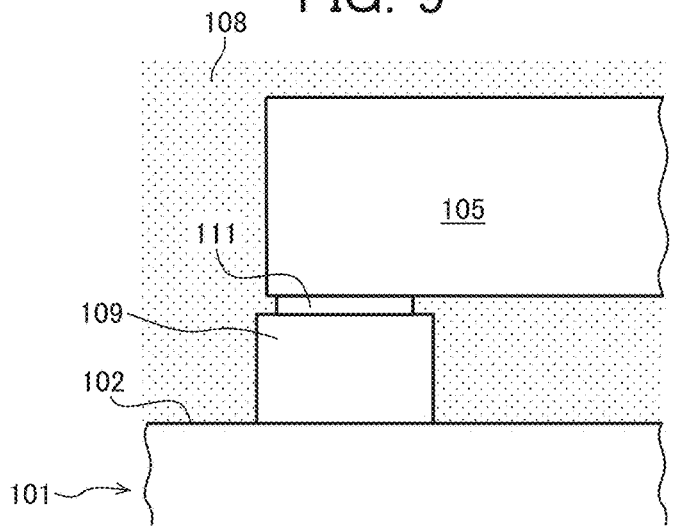
FIG. 9 is an enlarged view of a part of yet another embodiment of the MOSFET rectifier according to the first embodiment, the part corresponding to the portion W of FIG. 8.
Figure 10:
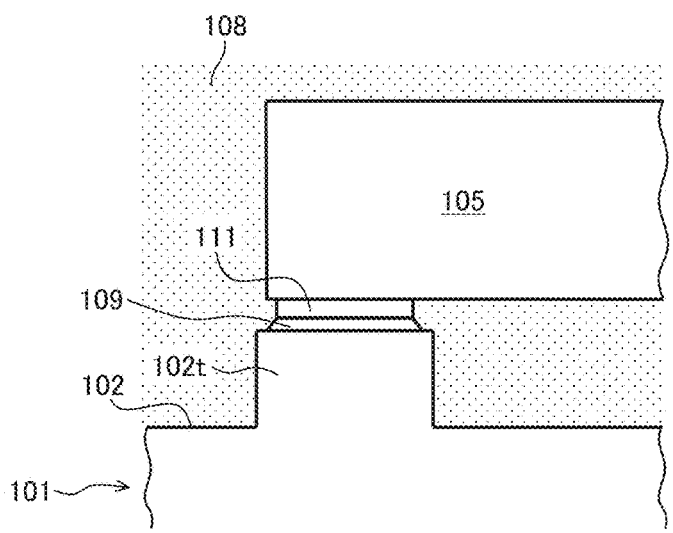
FIG. 10 is an enlarged view of a part of yet another embodiment of the MOSFET rectifier according to the first embodiment, the part corresponding to the portion W of FIG. 8.

Each of FIGS. 9 and 10 is an enlarged view of a part of yet another embodiment of the MOSFET rectifier according to the first embodiment, which part corresponds to the portion W of FIG. 8.

As shown in FIG. 9, the low-voltage-side terminal 111 of the capacitor 105 may be supported by solder 109 without using the metal plate 120. Or, as shown in FIG. 10, a projection 102$t$ may be provided on the pedestal 102 of the base electrode 101 as a substitute for the metal plate 120, thereby to support the low-voltage-side terminal 111 of the capacitor 105 through solder 109.

Those configurations shown in FIGS. 9 and 10 make it possible to reduce the number of components and thus lower costs.

The resin 108 is formed by transfer molding or potting so that the resin 108 encapsulates the pedestal 102, the electronic components (103, 104, 105) on the pedestal 102, and the electrodes (103$g$, 103$s$, 104$a$ to 104$d$). The resin 108 suppresses expansion of the pedestal 102, the electronic components (103, 104, 105), and the electrodes (103$g$, 103$s$, 104$a$ to 104$d$, and others) due to a temperature rise occurring therein, and reduces defects due to: thermal fatigue caused in a thermal fatigue test due to differences in the thermal expansion coefficient among the pedestal 102 and the electronic components (103, 104, 105); and/or thermal deterioration caused in a temperature cycling test.

It is preferable that, to prevent defects caused by the resin 108 being detached from the base electrode 101, as shown in FIG. 8, a groove 101$m$ may be formed on the base electrode 101 along the pedestal 102 such that the groove 101$m$ has an increasing diameter as approaching from a bottom portion of the groove 101$m$ to the surface of the pedestal 102 when viewed in top plan. This configuration allows the resin 108 to penetrate into the groove 101$m$ of the base electrode 101 to be fixed to the base electrode 101, and thus prevents the resin 108 from being detached from the base electrode 101.

The resin 108 has poor adhesion with the MOSFET chip 103 and the control circuit chip 104. In other words, the resin 108 is likely to be detached from them. So a coating material (second resin), which is so called junction coating resin (JCR) having better adhesion with semiconductor chips (103, 104) than the resin 108, is applied to side walls of the MOSFET chip 103 and the control circuit chip 104 to form thin films of JCR prior to forming the resin 108.

Application of JCR to the capacitor 105, the isolation substrate 106, and the lead electrode 107 also improves the adhesion of them (105, 106, 107) with the resin 108.

This configuration improves the adhesion of the resin 108 with the MOSFET chip 103 and the control circuit chip 104, thus reduces defects such as solder cracking or chip cracking occurring during a thermal fatigue test or a temperature cycling test, and thus improves reliability of the rectifier S1.

Incidentally the groove 101$m$ may be provided to and/or JCR may be applied to the rectifier S1 of the embodiment and later-described rectifiers S12 and S2.

<Rectifier S12 of Variant Embodiment 2>

Next, a rectifier S12 of a variant embodiment 2 will be described.

Figure 11:
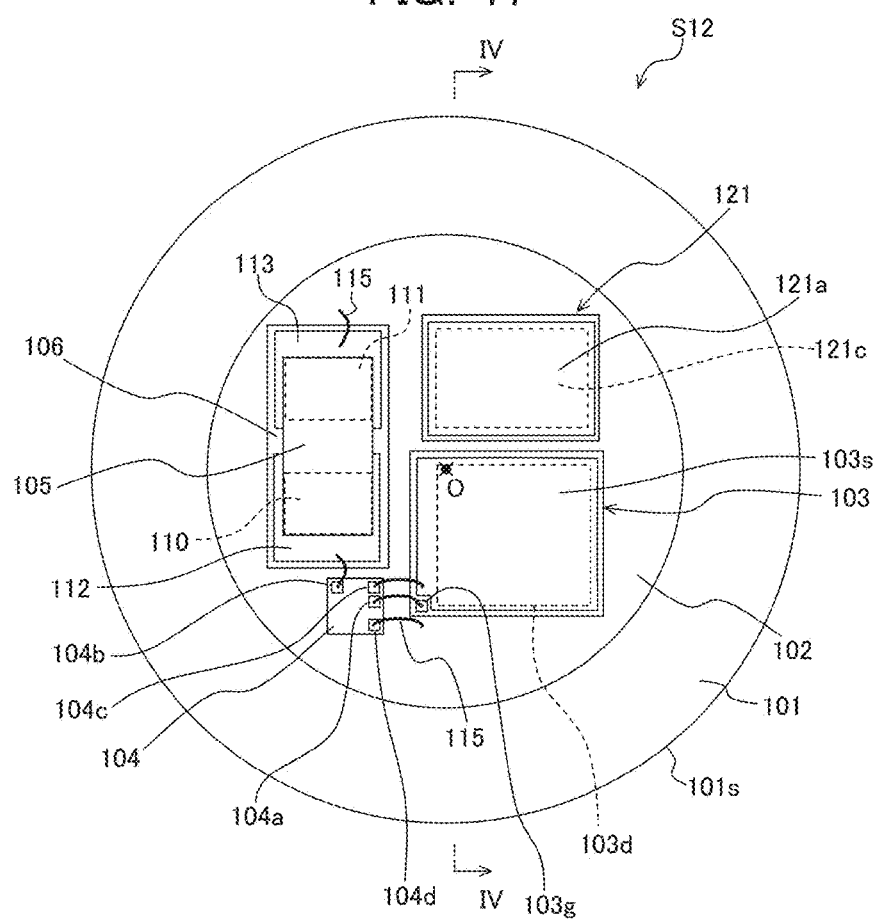
FIG. 11 is a top view of a rectifier of another embodiment (variant embodiment 2), on which rectifier a zener diode chip is mounted.
Figure 12:
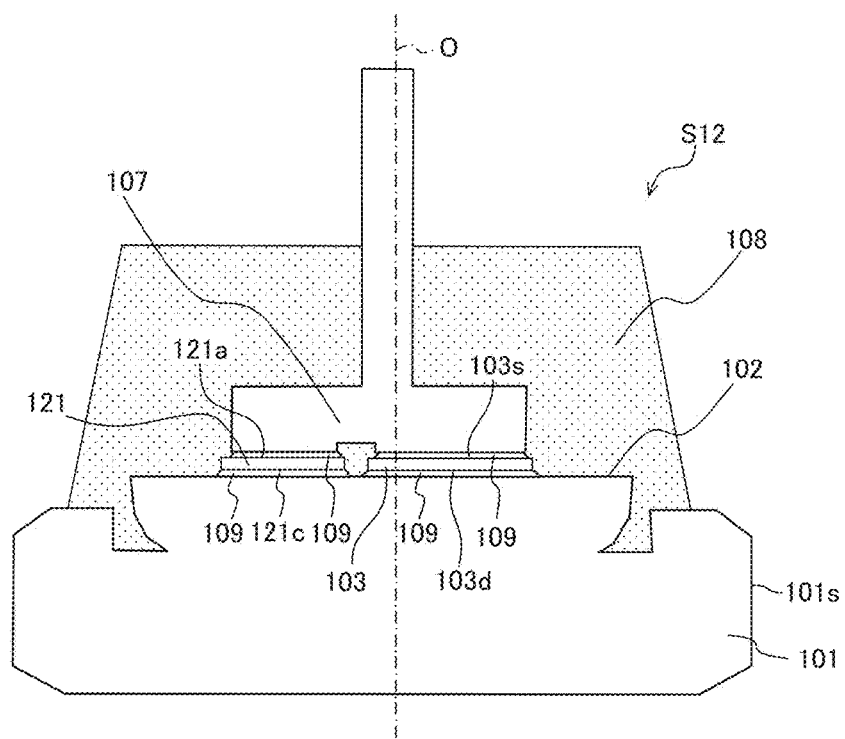
FIG. 12 is a cross-section taken along line IV-IV in FIG. 11.

FIG. 11 is a top view of a rectifier of another embodiment (variant embodiment 2), on which rectifier a zener diode chip is mounted. FIG. 12 is a cross-section taken along line IV-IV in FIG. 11.

The rectifier S12 may be provided with a zener diode to have a function of surge absorption.

In the rectifier S12 of the variant embodiment 2, a zener diode chip 121 is disposed alongside and adjacent to the MOSFET chip 103, on the pedestal 102. As shown in FIG. 12, like the MOSFET chip 103, the zener diode chip 121 has a lower surface on which a cathode electrode 121$c$ is formed and electrically connected through solder 109 to the base electrode 101, and has an upper surface on which an anode electrode 121$a$ is formed and electrically connected through solder 109 to the lead electrode 107.

The cathode electrode 121$c$ on the lower surface of the zener diode chip 121 has an extended surface connected through solder 109 to the extended surface of the pedestal 102 of the base electrode 101 with a large heat transfer area. The anode electrode 121$a$ on the upper surface of the zener diode chip 121 has an extended surface connected (coupled) through solder 109 to the lower surface (extended surface) of the lead electrode 107 with a large heat transfer area. This structure efficiently dissipates the heat generated in the zener diode chip 121 to the base electrode 101 and to the lead electrode 107.

The zener diode chip 121 has a large area in top plan view within a range in which surge absorption does not cause such a rise in the chip temperature that produces a defect in the solder 109 on the upper or lower portion of the chip. Connecting the upper portion and the lower portion of the zener diode chip 121 respectively to the lead electrode 107 and the base electrode 101 by solder 109 enables dissipation of the heat generated in the zener diode chip 121 in the event of a surge absorption to the lead electrode 107 and to the base electrode 101. This suppresses an increase in the temperature of the zener diode chip 121 and thus improves reliability of the zener diode chip 121.

The zener diode chip 121 may be integrated into the same chip of the MOSFET chip 103. Integration of the zener diode chip 121 into the same chip of the MOSFET chip 103 allows dissipation of the heat generated in the event of a surge absorption to the MOSFET chip 103, thereby to suppress an increase in the temperature of the zener diode chip 121 more effectively compared to a case in which the zener diode is provided as a separate chip.

For this reason, the integrated zener diode chip 121 having a smaller area compared to a separate zener diode chip when viewed in top plan can have a surge absorption effect equivalent to that of the separate zener diode chip. That is, the total chip area of the MOSFET chip 103 and the zener diode chip 121 in top plan view can be reduced to improve the area efficiency of those chips.

In contrast, when the zener diode chip 121 is separated from the MOSFET chip 103 as shown in FIG. 11, the area of the MOSFET chip 103, cost of which is high, can be reduced and thus the function of surge absorption is achieved at a lower cost compared to when the zener diode chip 121 and the MOSFET chip 103 are integrated in the same chip.

In the embodiment shown in FIGS. 1 to 3, the connection of the drain electrode 103d of the MOSFET chip 103 to the base electrode 101 and the connection of the source electrode 103s of the MOSFET chip 103 to the lead electrode 107 are made through solder 109. These connections, however, may be made by a press-fitting method. In the press-fitting method, a force of several kN/cm2 is applied between the base electrode 101 and the lead electrode 107 with the MOSFET chip 103 being placed therebetween, to establish an electrical and thermal connection between the drain electrode 103d of the MOSFET chip 103 and the base electrode 101 and between the source electrode 103s of the MOSFET chip 103 and the base electrode 107, without using solder.

As described above, "thermal connection" here means that, since the extended surface of the drain electrode 103d of the MOSFET chip 103 and the extended surface of the source electrode 103s of the MOSFET chip 103 are respectively press-fitted to be in contact with the extended surface of the base electrode 101 and the extended surface of the base electrode 107 to make connections with a large heat transfer area, the heat generated in the MOSFET chip 103 is effectively dissipated to the base electrode 101 and to the lead electrode 107.

Hereinabove, the synchronous rectification MOSFET rectifier S1 (S11, S12) according to the first embodiment has been explained with regard to their features and the effects thereof in detail. However, not all of the explained features need to be present in the rectifier. A rectifier having some of those features would provide the corresponding effects.

<Assembly Method of Rectifier S1>

Next, a description will be given of a method for assembling the synchronous rectification MOSFET rectifier S1 according to the first embodiment.

In the assembly, a carbon jig is used for fixing the components constituting the rectifier S1 to predetermined locations. The base electrode 101 is put in the carbon jig at a position where the pedestal 102 is fixed. Then, a lid of the carbon jig is put on the base electrode 101.

The lid has open holes in which other components are to be put. In an open hole for putting a MOSFET chip 103, a solder sheet (109), a MOSFET chip 103, a solder sheet (109) and a lead electrode 107 are stacked in this order; in an open hole for putting a control circuit chip 104, a solder sheet (109) and a control circuit chip 104 are stacked in this order; and in an open hole for putting a capacitor 105, a solder sheet (109), an isolation substrate 106, a solder sheet (109), and a capacitor 105 are stacked in this order.

Subsequently, the carbon jig in which the components have been put is baked in a soldering furnace to fix the MOSFET chip 103, the lead electrode 107, the control circuit chip 104, the isolation substrate 106, and the capacitor 105 on the pedestal 102 of the base electrode 101 by solder 109.

Subsequently, an assembly constituting the rectifier S1 is taken out from the carbon jig. Then, wiring on the assembly is carried out using a wire-bonding apparatus to form wires 115 respectively connecting between the control circuit chip 104 and the MOSFET chip 103, between the control circuit chip 104 and the pedestal 102, between the control circuit chip 104 and the isolation substrate 106, and between electrodes of the isolation substrate 106 and the pedestal 102.

After that, JCR is applied to side walls of the MOSFET chip 103 and the control circuit chip 104, and then resin 108 is formed by transfer molding or potting on the base electrode 101 to encapsulate the pedestal 102 and the components (103, 104, 105) on the pedestal 102.

After that, the resin 108 is cured in a cure furnace. This completes the assembly of the rectifier S1.

The step of forming a solder joint between the MOSFET chip 103 and the lead electrode 107 and between the isolation substrate 106 and the capacitor 105 may be carried out not in the first soldering step but after the step of wire-bonding.

Unlike a diode chip having only two electrodes on an upper surface and a lower surface of the diode chip, as shown in FIG. 1, the MOSFET chip 103 has the gate electrode 103g on the upper surface of the MOSFET chip 103 in addition to the source electrode 103s on the upper surface of the MOSFET chip 103 and the drain electrode 103d on the lower surface of the MOSFET chip 103. Thus when the MOSFET chip 103 is to be mounted on a package having a circular outer peripheral section 101s, positioning of the MOSFET chip 103 in a rotational direction around the rotation axis (center axis O of the outer peripheral section 101s in FIG. 1) is a matter of concern in the step of forming wiring on the gate electrode 103g.

Figure 13:
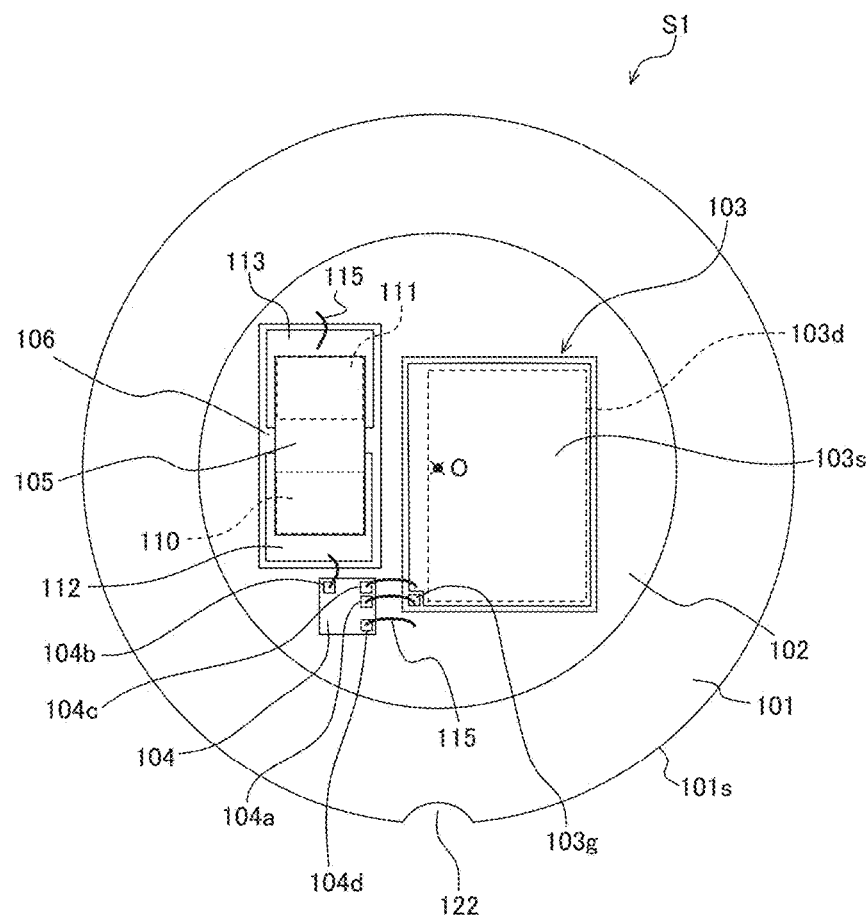
FIG. 13 is a top view of another embodiment of the MOSFET rectifier according to the first embodiment.
Figure 14:
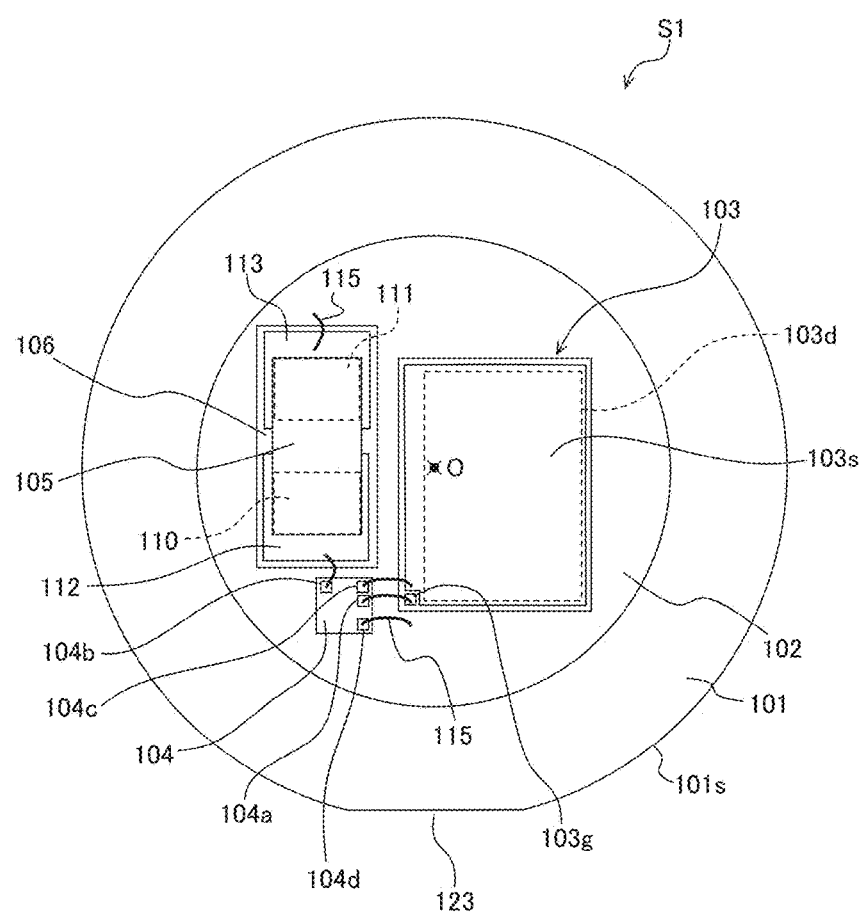
FIG. 14 is a top view of another embodiment of the MOSFET rectifier according to the first embodiment.

Each of FIGS. 13 and 14 is a top view of another embodiment of the MOSFET rectifier according to the first embodiment.

The outer peripheral section 101s of the base electrode 101 has a circular shape provided with a notch 122 shown in the top view presented in FIG. 13 or an orientation flat 123 shown in the top view presented in FIG. 14, for positioning the MOSFET chip 103 in the rotational direction around the rotation axis (center axis O of the outer peripheral section 101s shown in FIGS. 13 and 14) in the step of forming wiring on the gate electrode 103g.

In the case of a rectifier S1 to be pressed-in and fixed to an alternator Ot (see FIG. 22), the outer peripheral section 101s of the base electrode 101 shown in FIG. 5 is formed to have a side wall on which projections and recesses extending in an up-down direction, so called a knurling 101r, are provided (alternating projections and recesses are formed in a circumferential direction of the outer peripheral section 101s such that the alternating projections and recesses respectively have a height and a depth in a radial direction). The notch 122 or orientation flat 123, which is for positioning in the rotational direction around the rotation axis (center axis O of the outer peripheral section 101s shown in FIGS. 13 and 14), is configured to have a larger dimension than a groove of the knurling 101r (see FIG. 5). Note that, in FIGS. 13 and 14, illustration of the knurling 101r is omitted.

The carbon jig for assembly has a hole in which the base electrode 101 is to be fixed. The hole is formed to fit with a base electrode 101 having the notch 122 or the orientation flat 123 so that the base electrode 101 fits in the hole only in a certain position in the rotational direction around the rotation axis.

In addition, the wire-bonding apparatus is configured so as to be able to fix the base electrode 101 in conformity with the direction of the notch 122 or the orientation flat 123. This configuration makes it possible to identify the positions of the electronic components (103, 104, 105) in a MOSFET rectifier S1, thus eliminates the need for positioning the MOSFET rectifier S1 in the rotational direction around the rotation axis in a soldering step and enables easy assembly of the outer peripheral section 101s of the base electrode 101 into a circular package.

Figure 15:
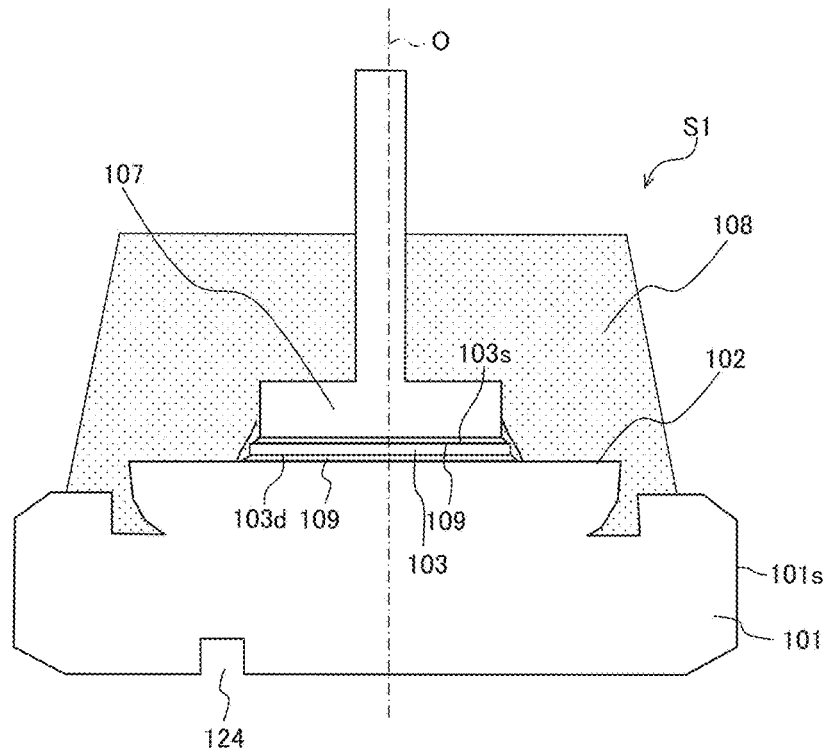
FIG. 15 is a cross section of another embodiment of the MOSFET rectifier according to the first embodiment, taken along a line corresponding to line I-I in FIG. 1.

FIG. 15 is a cross section of another embodiment of the MOSFET rectifier according to the first embodiment, the cross section taken along a line corresponding to line I-I in FIG. 1.

As shown in FIG. 15, a recess 124 may be provided on a bottom portion of the base electrode 101 as another means to position the MOSFET rectifier S1 in the rotational direction around the rotation axis (center axis O of the outer peripheral section 101s shown in FIG. 15).

The recess 124 may have a circular shape, a square shape, or a rectangular shape in bottom plan view, may have a column shape or a sphere shape in a depth direction, may be positioned to intersect the center O of the outer peripheral section 101s or spaced apart from the center O, provided that the recess 124 is not symmetry with respect to the center O when the base electrode 101 is viewed from below (when the base electrode 101 is viewed from the bottom side of FIG. 15). A single or a plurality of recesses 124 may be provided. Incidentally, it is preferable for the recess 124 to have a circular shape in bottom plan view because of the readiness with which positioning in the rotational direction around the rotation axis is carried out.

The fixing hole of the carbon jig for assembly, to which the base electrode 101 is to be fixed, is provided with a projection which is in conformity with the shape of the recess 124 so that the base electrode 101 fits in the fixing hole only in a predefined position in the rotational direction around the rotation axis (center axis O of the outer peripheral section 101s in FIG. 15).

In addition, the wire-bonding apparatus is configured to have a hole in which the rectifier is to be set, and the hole is also provided with a fixing projection which is in conformity with the shape of the recess 124 so that the base electrode 101 fits in the hole only in a predefined position in the rotational direction around the rotation axis.

This configuration makes it possible to readily assemble a MOSFET rectifier S1 in a package whose outer peripheral section 101s is in a circular shape Another method for positioning the rectifier in the rotational direction around the rotation axis (center axis O of the outer peripheral section 101s shown in FIG. 15) is to make the wire-bonding apparatus have a mechanism for positioning the rectifier in the rotational direction around the rotation axis.

For example, the mechanism for positioning the rectifier in the rotational direction around the rotation axis has: a visual identification apparatus for identifying the positions of the components, such as the capacitor 105; a motor controlling a rotational position; a deceleration mechanism of the motor; a rotation member which is rotated by the deceleration mechanism to carry out the positioning of the rectifier; a rotational position sensor; and a control apparatus controlling those to carry out control for the positioning of wire-bonding.

The visual identification apparatus identifies the positions of the components, such as the MOSFET chip 103, the control circuit chip 104, and the capacitor 105, which have been fixed onto the pedestal 102 by solder 109. Then the above mechanism carries out positioning of the rectifier in the rotational direction around the rotation axis, and then necessary wire-bonding is carried out. In this case, in order to eliminate the need of positioning of the rectifier in the carbon jig, electrical connections other than wire-bonding connections are made in one soldering step.

Figure 16:
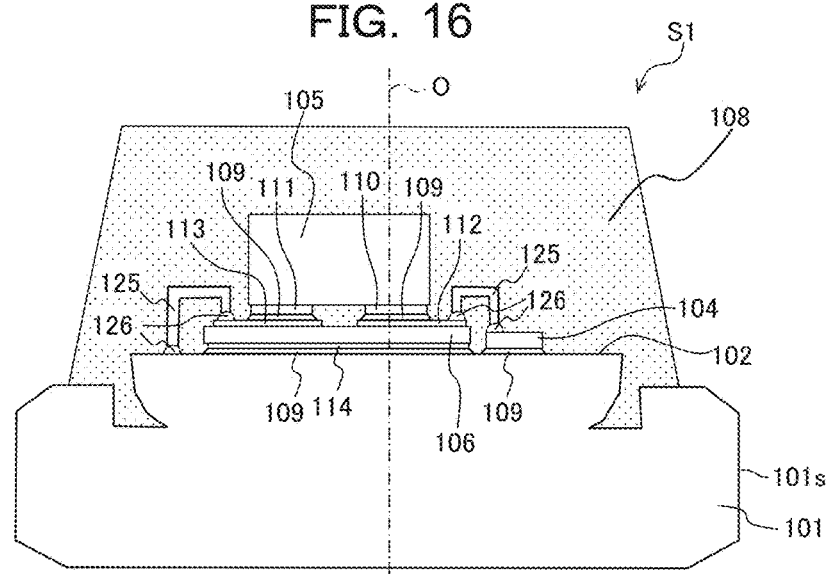
FIG. 16 is a cross section of another embodiment of the MOSFET rectifier according to the first embodiment, taken along a line corresponding to line II-II in FIG. 1.

FIG. 16 is a cross section of another embodiment of the MOSFET rectifier according to the first embodiment, the cross section taken along a line corresponding to line II-II in FIG. 1.

Yet another method for positioning the rectifier in the rotational direction around the rotation axis (center axis O of the outer peripheral section 101s shown in FIG. 16) is to make connections by, in place of forming wires by wire-bonding, fixing copper plates 125 or copper wires 125, which are each formed in a shape capable of making a connection, by solder balls 126 or solder bumps 126.

For example, in FIG. 1, connections made by wires 115, including those not shown in FIG. 16, are replaced with connections made with copper plates 125 or copper wires 125, which are each formed in a shape capable of making a connection, via solder balls 126 or solder bumps 126. A step of soldering the copper plates 125 or copper wires 125 is carried out in the same step as the step of soldering for connections among the MOSFET chip 103, the lead electrode 107, the control circuit chip 104, the isolation substrate 106, and the capacitor 105.

That is, a single step of soldering makes electrical connections for all the components. Making all the electrical connections in a single step eliminates the need for positioning in the rotational direction around the rotation axis (center axis O of the outer peripheral section 101s shown in FIG. 16).

It is noted that, although the copper plate 125 or the copper wire 125 is presented as an example of conductor for connection, a conductor other than copper may be used.

Figure 17:
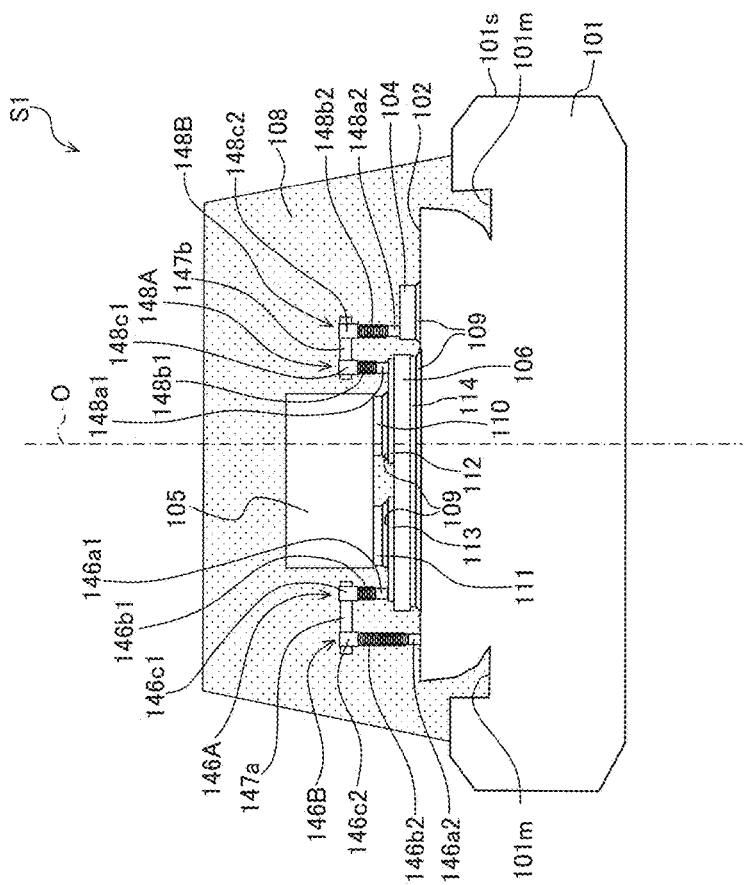
FIG. 17 is a cross section of another embodiment of the MOSFET rectifier according to the first embodiment, taken along a line corresponding to line II-II in FIG. 1.

FIG. 17 is a cross section of another embodiment of the MOSFET rectifier according to the first embodiment, the cross section taken along a line corresponding to line II-II in FIG. 1.

In FIG. 16, a copper plate 125 or copper wire 125 is presented as an example of a conductor to be connected by solder. Instead, as shown in FIG. 17, copper pins with spring 146A, 146B, 148A, and 148B each having spring mechanism may be used to establish electrical connections by means of elastic forces of the springs of the copper pins.

Specifically, the pin with spring 146A and the pin with spring 146B are fixed with a copper bar 147a.

The pin with spring 146A has a lower portion in which a terminal 146a1 is formed, a middle portion to which a spring 146b1 is attached, and an upper portion in which a fixed portion 146c1 is formed. The pin with spring 146B has a lower portion in which a terminal 146a2 is formed, a middle portion to which a spring 146b2 is attached, and an upper portion in which a fixed portion 146c2 is formed.

The elastic force of the spring 146b1 presses the terminal 146a1 against the electrode 113 of the isolation substrate 106 and the elastic force of the spring 146b2 presses the terminal 146a2 against the pedestal 102 of the base electrode 101, thereby to electrically connect the electrode 113 of the isolation substrate 106 to the pedestal 102 of the base electrode 101, without solder.

The pin with spring 148A and the pin with spring 148B are fixed with a copper bar 147b.

The pin with spring 148A has a lower portion in which a terminal 148a1 is formed, a middle portion to which a spring 148b1 is attached, and an upper portion in which a fixed portion 148c1 is formed. The pin with spring 148B has a lower portion in which a terminal 148a2 is formed, a middle portion to which a spring 148b2 is attached, and an upper portion in which a fixed portion 148c2 is formed.

The elastic force of the spring 148b1 presses the terminal 148a1 against the electrode 112 of the isolation substrate 106 and the elastic force of the spring 148b2 presses the terminal 148a2 against the second electrode 104b of the control circuit chip 104, thereby to electrically connect the electrode 112 of the isolation substrate 106 to the second electrode 104b of the control circuit chip 104 (see FIG. 1), without solder.

Each of the copper bars 147a and 147b is for example temporarily fixed to the isolation substrate 106 by a screw not shown in the figure, and then sealed and fixed by the resin 108 as shown in FIG. 17.

As described above, the use of the above-mentioned pins with spring 146A, 146B, 148A, and 148B in place of wires 115 improves reliability against failure of connection.

Second Embodiment

Figure 18:
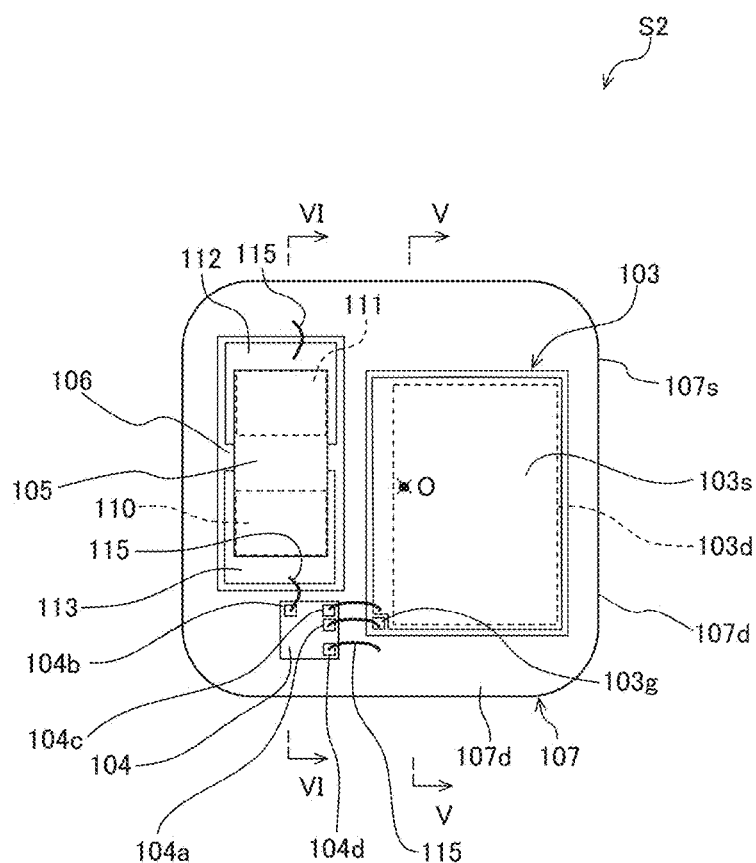
FIG. 18 is a bottom view of a synchronous rectification MOSFET rectifier according to a second embodiment of the invention, omitting illustration of part of the package of the rectifier.
Figure 19:
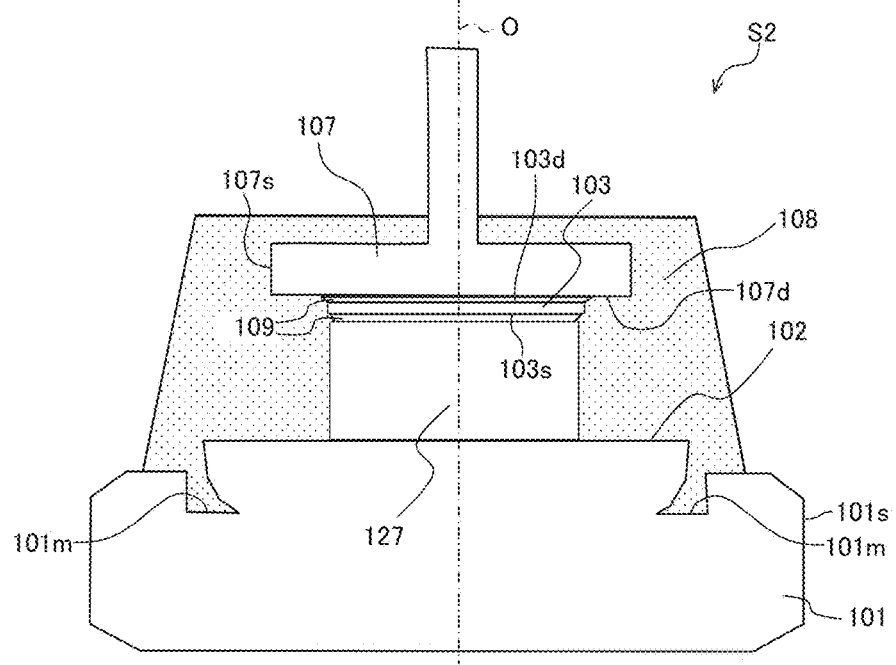
FIG. 19 is a cross-section taken along line V-V in FIG. 18.
Figure 20:
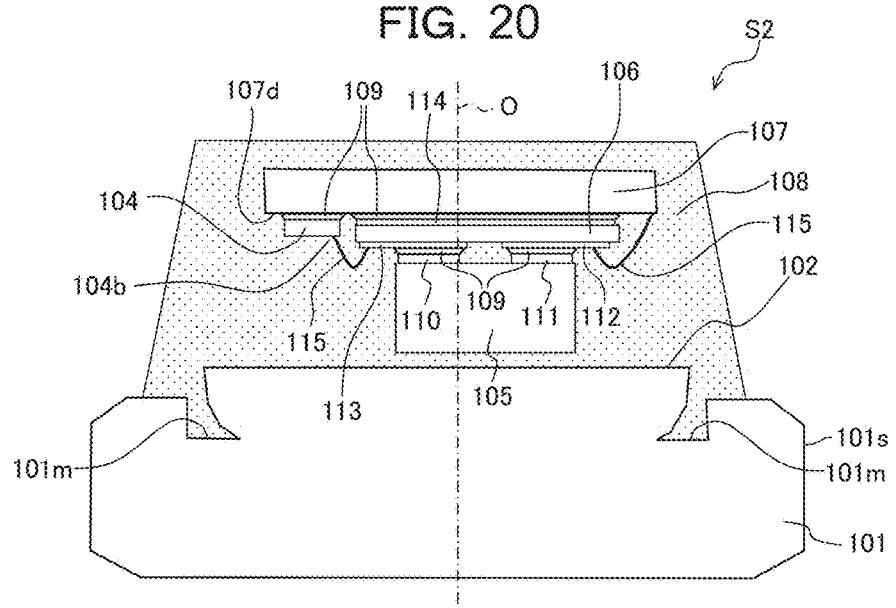
FIG. 20 is a cross-section taken along line VI-VI in FIG. 18.

Reference is now made to FIGS. 18 to 20 to illustrate the structure of a synchronous rectification MOSFET rectifier S2 according to a second embodiment of the invention.

FIG. 18 is a bottom view of a synchronous rectification MOSFET rectifier according to a second embodiment of the invention, omitting illustration of part of the package thereof.

(In the following description of the second embodiment, contrary to the first embodiment, an upper surface and a lower surface are identified based on an arrangement in which a lead electrode 107 is arranged at a lower position and a base electrode 101 is arranged at an upper position.)

In FIG. 18, for easier understanding, illustration of the base electrode 101, a later-described electrode block 127 (see FIG. 19) connecting a MOSFET chip 103 with the base electrode 101, and a resin 108 is omitted.

FIG. 19 is a cross-section taken along line V-V in FIG. 18. FIG. 20 is a cross-section taken along line VI-VI in FIG. 18.

Figure 21:
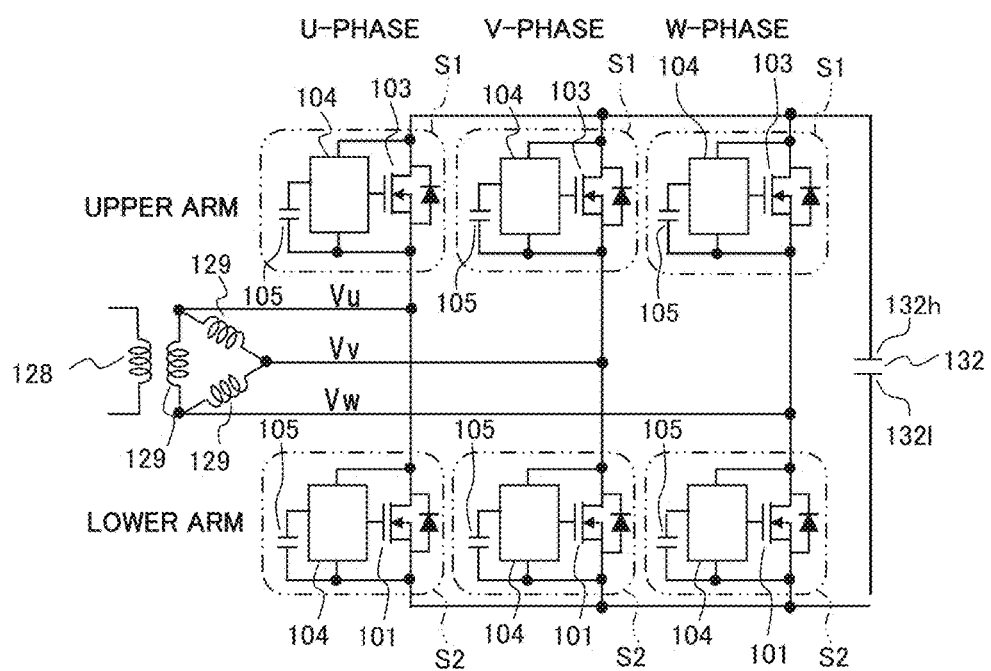
FIG. 21 is a circuit diagram of an alternator using MOSFET rectifiers according to the first embodiment and MOSFET rectifiers according to the second embodiment.

FIG. 21 is a circuit diagram of the rectification circuit of an alternator Ot using autonomous, synchronous rectification MOSFET rectifiers S1, S2 respectively according to the first and second embodiments.

The synchronous rectification MOSFET rectifier S1 according to the first embodiment, which has been described referring to FIGS. 1 to 3, is a rectifier used in an upper arm (see FIG. 21), so-called forward side, of a rectification circuit of the alternator Ot. As shown in FIG. 2, in the synchronous rectification MOSFET rectifier S1, the drain electrode 103d of the MOSFET chip 103 is connected to the base electrode 101 and the source electrode 103s of the MOSFET chip 103 is connected to the lead electrode 107.

In contrast, the synchronous rectification MOSFET rectifier S2 according to the second embodiment of the invention, which is to be described referring to FIGS. 18 to 20, is a rectifier used in a lower arm (see FIG. 21), so-called reverse side, of the rectification circuit of the alternator Ot. As shown in FIG. 19, in the synchronous rectification MOSFET rectifier S2, the drain electrode 103d of the MOSFET chip 103 is connected to the lead electrode 107 and the source electrode 103s of the MOSFET chip 103 is connected through an electrode block 127 to the base electrode 101.

This configuration constructs a reverse-side rectifier S2.

The constituent elements of the rectifier S2 are basically the same as those of the synchronous rectification MOSFET rectifier S1 according to the first embodiment shown in FIG. 1.

As shown in FIGS. 18 to 20, the synchronous rectification MOSFET rectifier S2 according to the second embodiment has: a lead electrode 107 having a rectangular outer peripheral section 107s (see FIG. 18); a pedestal 107d which is provided in the lead electrode 107 and on which electronic components are mounted; a MOSFET chip 103, a control circuit chip 104, and a capacitor 105, which are mounted on the pedestal 107d; an isolation substrate 106 which has electrodes 112 and 113 and which is placed under the capacitor 105; an electrode block 127 mounted on the MOSFET chip 103 (see FIG. 19); a base electrode 101; and a resin 108 encapsulating a pedestal 102 provided in the base electrode 101 and the electronic components (103, 104, 105).

The MOSFET chip 103, control circuit chip 104, capacitor 105, and isolation substrate 106 of the reverse-side rectifier S2 are the same as those used for the forward-side rectifier S1 described in the first embodiment (see FIGS. 1 to 3). Use of the same components in the forward-side rectifier S1 and in the reverse-side rectifier S2 will lead to a low component cost by virtue of mass production of identical components.

The pedestal 107d of the lead electrode 107 has a rectangular shape in bottom plan view as presented in FIG. 18, which shows a view viewed from an upper surface of the pedestal 102 of the base electrode 101. However, the pedestal 107d may have a circular shape in bottom plan view. When the pedestal 107d is configured to have a rectangular shape, that shape suits the shapes of the MOSFET chip 103, the capacitor 105, and the control circuit chip 104, which are each rectangular like the shape of the pedestal 107d. This makes it possible to reduce the area of the pedestal 107d. Meanwhile, when the pedestal 107d of the lead electrode 107 is configured to have a circular shape in bottom plan view, that shape makes it possible to lower the stress applied to an end section of the pedestal 107d by avoiding concentration of stress.

The connection and arrangement of the components of the second embodiment shown in FIGS. 18 to 20 are the same as those of the synchronous rectification MOSFET rectifier S1 according to the first embodiment shown in FIG. 1, except that the connection among the chips (103 to 106) is made with the base electrode 101 and the lead electrode 107 being exchanged for each other and the electrode block 127 is interposed between the MOSFET chip 103 and the base electrode 101.

As shown in FIG. 19, the drain electrode 103d formed on a lower surface of the MOSFET chip 103 is electrically connected to the pedestal 107d of the lead electrode 107 by solder 109. In this connection, an extended surface of the drain electrode 103d of the MOSFET chip 103 is connected (coupled) through solder 109 to an extended surface of the lead electrode 107 with a large heat transfer area. On the other hand, a source electrode 103s on an upper surface of the MOSFET chip 103 is electrically connected through the electrode block 127 to the pedestal 102 of the base electrode 101, using solder 109.

In this connection, an extended surface of the source electrode 103s on the upper surface of the MOSFET chip 103 is connected (coupled) through the electrode block 127 to an extended surface of the pedestal 102 of the base electrode 101 with a large heat transfer area.

The electrode block 127 is a member to provide a distance between the base electrode 101 and the pedestal 107d of the lead electrode 107. The electrode block 127 may be integrally formed in the base electrode 101. Or, the source electrode 103s of the MOSFET chip 103 may be directly connected to the base electrode 101 using solder 109, without using the electrode block 127.

As shown in FIG. 18, a gate electrode 103g on the upper surface of the MOSFET chip 103 is electrically connected through a wire 115 to a first electrode 104a on an upper surface of the control circuit chip 104.

As shown in FIG. 20, the capacitor 105 is fixed to the isolation substrate 106 by solder 109 and the isolation substrate 106 is fixed to the pedestal 107d of the lead electrode 107 by solder 109. As to electrical connection, a high-voltage-side terminal 110 of the capacitor 105 is connected to an electrode 113 on an upper surface of the isolation substrate 106 by solder 109, and the electrode 113 on the upper surface of the isolation substrate 106 is connected to a second electrode 104b (see FIG. 18) provided on the upper surface of the control circuit chip 104 by a wire 115.

Likewise, as to electrical connection, a low-voltage-side terminal 111 of the capacitor 105 is connected to an electrode 112 on the upper surface of the isolation substrate 106 by solder 109, and the electrode 112 on the upper surface of the isolation substrate 106 is connected to the pedestal 107d of the lead electrode 107 by a wire 115.

As described above, as shown in FIG. 18, in the reverse-side rectifier S2, the first electrode 104a, which is one of the electrodes on the upper surface of the control circuit chip 104, is electrically connected to the gate electrode 103g of the MOSFET chip 103 by a wire 115; the second electrode 104b, which is another one of the electrodes on the upper surface of the control circuit chip 104, is electrically connected to the electrode 113 on the upper surface of the isolation substrate 106 by a wire 115, to which electrode 113 the high-voltage-side terminal 110 of the capacitor 105 is connected.

A third electrode 104c, which is another one of the electrodes on the upper surface of the control circuit chip 104, is electrically connected to the source electrode 103s of the MOSFET chip 103. A fourth electrode 104d, which is another one of the electrodes on the upper surface of the control circuit chip 104, is electrically connected to the pedestal 107d of the lead electrode 107 by a wire 115.

The configurations and operations of the circuit of the synchronous rectification MOSFET rectifier S2 according to the second embodiment are the same as those of the synchronous rectification MOSFET rectifier S2 according to the first embodiment, which have been described referring to FIG. 4. The same components and circuit of the forward-side rectifier S1 according to the first embodiment are used for the components and circuit of the reverse-side rectifier S2 according to the second embodiment, thereby leading to a decrease in design cost and development cost and leading to a decrease in testing cost by conducting the same test. Further, it is possible to reduce costs by mass production of the same components and the same circuit.

The synchronous rectification MOSFET rectifier S2 according to the second embodiment has the same features and effects as those of the previously-described synchronous rectification MOSFET rectifier S1 according to the first embodiment.

The method for assembling the synchronous rectification MOSFET rectifier S2 according to the second embodiment is basically the same as the one for the synchronous rectification MOSFET rectifier S1 according to the first embodiment. The method for assembling the synchronous rectification MOSFET rectifier S2 according to the second embodiment differs from the one for the synchronous rectification MOSFET rectifier S1 according to the first embodiment in that, as shown in FIGS. 19 and 20, the electronic components (103, 104, 105) are mounted on the pedestal 107d of the lead electrode 107 to make connections among them, rather than on the pedestal 102 of the base electrode 101.

The method further differs in that the electrode block 127, which serves as an electrode and a spacer, is interposed between the MOSFET chip 103 and the base electrode 101. Moreover, the pedestal 107d of the lead electrode 107 need not be formed in a circular shape in bottom plan view, thus the method does not necessarily include an assembly step of positioning the rectifier in a rotational direction around a rotation axis like the step conducted for assembly of the synchronous rectification MOSFET rectifier S1 according to the first embodiment. For example, when the pedestal 107d of the lead electrode 107 is formed in a square shape in bottom plan view as shown in FIG. 18, the positions of the electronic components (103, 104, 105) are determinable on the basis of the sides of the shape.

In contrast, when the pedestal 107d of the lead electrode 107 is formed in a circular shape in bottom plan view, it is difficult to identify the positions of the components on the pedestal 107d. Thus it is necessary to employ a method similar to the method for positioning the synchronous rectification MOSFET rectifier S1 according to the first embodiment in a rotational direction around the rotation axis (center axis O), which is as shown in FIGS. 13, 14, and 15.

Incidentally, the various configurations of the rectifiers S1, S11, S12 described for the first embodiment may be applied to the rectifier S2 of the second embodiment in a combined manner as appropriate.

<Configuration of Rectification Circuit of Alternator Ot>

Reference is now made to FIG. 21 to illustrate the structure of a rectification circuit of an alternator Ot (see FIG. 22) using the autonomous, synchronous rectification MOSFET rectifiers S1, S2 according to the present invention. FIG. 22 is a cross-section of a substantial part of an alternator in which synchronous rectification MOSFET rectifiers are employed.

The alternator Ot is a three-phase full-wave rectifying circuit which carries out six-phase rectification with six rectifiers. A coil 128 of a rotor and delta-connected three coils 129 of a stator, shown in FIG. 22, constitute an electric power generation unit. The delta-connected three coils 129 of the stator has midpoints interconnecting the three coils 129, from which midpoint wiring for U-phase, V-phase, and W-phase circuits shown in FIG. 21 are respectively made. The coils 129 of the stator may be connected in a Y-connection, in which the wiring of the U-phase, V-phase, and the W-phase circuits (coils 129) forms a Y-shape, instead of the delta-connection forming a delta-shape.

Each of the U-phase, the V-phase, and the W-phase circuits is connected with a forward-side, synchronous rectification MOSFET rectifier S1 according to the first embodiment in the high-side of the midpoint wiring of the circuit, and connected with a reverse-side, synchronous rectification MOSFET rectifier S2 according to the second embodiment in the low-side of the midpoint wiring of the circuit. The high-side synchronous rectification MOSFET rectifier S1 is connected with a high-voltage-side terminal 132h of a battery 132, and the low-side synchronous rectification MOSFET rectifier S2 is connected with a low-voltage-side terminal 132l of the battery 132.

The synchronous rectification MOSFET rectifiers S1 and S2 each have a circuit configuration shown in FIG. 4, which is constituted by a MOSFET chip 103, a control circuit chip 104, and a capacitor 105. The rectifier S1, which is on the high side, and the rectifier S2, which is on the low side, are each constituted by the same MOSFET chip 103, the same control circuit chip 104, and the same capacitor 105.

Since the low-side rectifier S2 is located in a position near to a body of the alternator Ot and thus it is easy to supply electric power to the control circuit chip 104 from an external source, the low-side rectifier S2 only may be configured to receive power supply from an external source without incorporating the capacitor 105. In this case, the cost of the rectifier S2 is lowered for the amount of the cost of the capacitor 105.

As shown in FIG. 21, the synchronous rectification MOSFET rectifiers S1 and S2 are each configured to have two terminals and thus the alternator can have the same rectification circuit configuration as that of an alternator using conventional diode rectifiers.

<Operation of the rectification circuit of alternator Ot>

FIG. 21 illustrates a circuit diagram of the rectification circuit of an alternator Ot using the synchronous rectification MOSFET rectifiers S1, S2 according to the present invention. The operation of the rectification circuit will be described below.

In the alternator Ot shown in FIG. 22, electric power is generated by the coil 129 of the rotor rotating in the coils 128 of the stator. In this operation, alternating current power is generated in each coil of the U-phase, the V-phase, and the W-phase circuits. According to the alternating current power, a voltage Vu at the midpoint of the U-phase circuit rises and falls in a periodic fashion.

Below, a description will be given of a rectification performed by a high-side rectifier S1 when the voltage Vu at the midpoint of the U-phase circuit rises. When the voltage Vu at the midpoint of the U-phase circuit, the voltage at the source terminal 103s of a high-side MOSFET chip 103, rises to reach a voltage VB of the high-voltage-side terminal 132h of the battery 132, the voltage applied to the comparator 116's second input terminal 116i2, shown in FIG. 4, becomes higher than the voltage applied to the comparator 116's first input terminal 116i1 connected to the drain terminal 103d of the MOSFET chip 103, causing the comparator 116 to change the state of its output terminal 116o from a low voltage state to a high voltage state.

This causes the gate driver 117 to raise the voltage at the gate terminal 103g of the MOSFET chip 103, changing the MOSFET chip 103 to an ON state. As a result, a current flows from the source terminal 103s of the MOSFET chip 103 to the drain terminal 103d thereof, i.e., a rectification operation is carried out.

When the voltage Vu at the midpoint of the U-phase circuit shown in FIG. 21 falls to reach a voltage VB at the drain terminal 103d of the high-side MOSFET chip 103, the magnitude relation between the voltages at the two input terminals (116i1, 116i2) of the comparator 116 is reversed, causing the comparator 116 to change the state of its output terminal 116o from a high voltage state to a low voltage state. This causes the gate driver 117 to lower the voltage at the gate terminal 103g of the MOSFET chip 103, changing the MOSFET chip 103 to an OFF state, in which the electrical connection between the source terminal 103s and the drain terminal 103d is disconnected.

A rectification operation carried out by a low-side rectifier S2 is the same as that of the above-described rectification operation by a high-side rectifier S1. When the voltage Vu at the midpoint of the U-phase circuit further falls to reach the voltage at the low-voltage-side terminal of the battery, the MOSFET chip 103 is set in an ON state; and then when the voltage Vu at the midpoint of the U-phase circuit rises back to reach the voltage at the low-voltage-side terminal of the battery the MOSFET chip 103 is set in an OFF state, i.e., a rectification operation is carried out.

Figure 23:
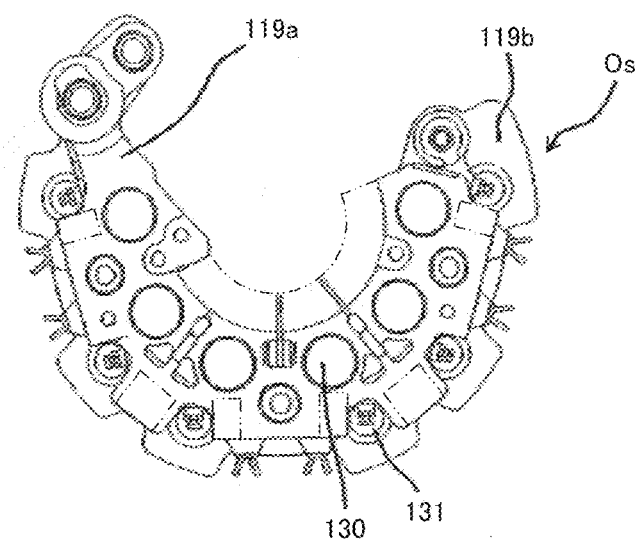
FIG. 23 is a plan view of a rectification apparatus to which a plurality of synchronous rectification MOSFET rectifiers according to the embodiments are fixed.

Reference is now made to FIGS. 22 and 23 to illustrate the alternator Ot using synchronous rectification MOSFET rectifiers S1 and S2. FIG. 23 is a plan view of a rectification apparatus to which a plurality of synchronous rectification MOSFET rectifiers according to the present embodiments (present invention) are fixed.

A rectification apparatus Os, shown in FIG. 23, to which synchronous rectification MOSFET rectifiers S1 and S2 according to the present embodiment are fixed has: a plurality of forward-side, synchronous rectification MOSFET rectifiers S1 according to the first embodiment; a positive-side heat dissipation plate 119a to which the plurality of forward-side rectifiers S1 are pressed-in to be fixed (see FIG. 5) and which functions as a heat dissipation member; a plurality of reverse-side, synchronous rectification MOSFET rectifiers S2 according to the second embodiment; a negative-side heat dissipation plate 119b to which the plurality of reverse-side rectifiers S2 are pressed-in to be fixed and which functions as a heat dissipation member; and a connection terminal 133 which is provided to electrically connect the forward-side rectifiers S1 with the reverse-side rectifiers S2 and to maintain a certain insulation distance between the positive-side heat dissipation plate 119a and the negative-side heat dissipation plate 119b.

In the configuration shown in FIG. 22, the forward-side rectifiers S1 and the reverse-side rectifiers S2 are arranged in such a manner that the lead electrodes 107 of the forward-side rectifiers S1 are opposed to the lead electrodes 107 of the reverse-side rectifiers S2 and those lead electrodes 107 are connected to the connection terminal 133.

As described above, the synchronous rectification MOSFET rectifiers S1 and S2 according to the first embodiment each have a base electrode 101 having a circular outer peripheral section 101s. This simplifies operations for pressing-in and fixing a plurality of rectifiers S1 and a plurality of rectifiers S2 respectively to the heat dissipation plates 119a and 119b.

The rectifiers on the high-side of the U-phase, V-phase, and W-phase circuits each have a MOSFET chip 103 whose drain terminal 103d is electrically connected to a common terminal. Thus, forward-side rectifiers S1, in each of which the drain terminal 103d is electrically connected to a base electrode 101 having good heat dissipation capability, are used in the high side circuits. This configuration makes it possible to fix the rectifiers on the high-side of the U-phase, V-phase, and W-phase circuits to a single heat dissipation plate 119a and to obtain a greater heat dissipation effect by using a larger heat dissipation plate.

The rectifiers on the low-side of the U-phase, V-phase, and W-phase circuits each have a MOSFET chip 103 whose source terminal 103s is electrically connected to a common terminal. Thus, reverse-side rectifiers S2, in each of which the source terminal 103s is electrically connected to a base electrode 101 having good heat dissipation capability, are used in the low-side circuits. This configuration makes it possible to fix the rectifiers on the low-side of the U-phase, V-phase, and W-phase circuits to a single heat dissipation plate 119b and to obtain a greater heat dissipation effect by using a larger heat dissipation plate.

In each of U-phase, V-phase, and W-phase circuits, the source terminal 103s of the MOSFET chip 103 of the corresponding rectifier on the high-side of the circuit, the drain terminal 103d of the MOSFET chip 103 of the corresponding rectifier on the low-side of the circuit, and a terminal of the stator 129 which terminal corresponds to the phase of the circuit are electrically connected with one another. The use of forward-side rectifiers S1 on the high-side circuits and reverse-side rectifiers S2 on the low-side circuits results in an arrangement in which the fine lead electrodes 107 of the forward-side rectifiers S1 are opposed to the fine lead electrodes 107 of the reverse-side rectifiers S2. This arrangement makes it easy to electrically connect the lead electrodes 107 of the rectifiers to the stator 129. In addition, the arrangement makes it possible to reduce the gap between the positive-side heat dissipation plate 119a and the negative-side heat dissipation plate 119b and thus reduce the size of the alternator.

Each of the rectifiers S1 and S2 has a base electrode 101 with a circular outer peripheral section 101s and has a lead electrode 107 above the base electrode 101. This enables use of highly-versatile heat dissipation plates 119a and 119b.

The alternator Ot, shown in FIG. 22, using synchronous rectification MOSFET rectifiers S1 and S2 according to the present embodiments is constituted by a front frame 134; a rear frame 135; a rectification apparatus Os to which a plurality of synchronous rectification MOSFET rectifiers S1 and S2, which have been described by the first and second embodiments, are pressed-in to be fixed; a rotor 128; a stator 129; brushes 137; an IC regulator 138; and a protection cover 139.

They, including the heat dissipation plates 119a and 119b, have the same configurations as those of an alternator using diode rectifiers generally used. The use of the synchronous rectification MOSFET rectifiers S1 and S2 does not necessitates modification to the structure of the alternator itself, thus leading to a decrease in the cost and leading to improvement in versatility.

In the alternator Ot shown in FIG. 22, an excitation current flowing in a field winding 141 through brushes 137 and slip rings 140 causes magnetization of individual rotor cores 142. While the rotor cores 142 are magnetized, when the rotational driving force is transferred from an engine of the vehicle (not shown) to a shaft 144 through a pulley 143 and thus the rotor 128 rotates, an alternating current power is generated in the stator 129 by electromagnetic induction. The alternating current power generated in the stator 129 is, as shown in FIG. 21, rectified by the forward-side rectifiers S1 and the reverse-side rectifiers S2 to a direct current power outputted from an output terminal 145. The direct current power is used to drive electronic devices mounted on the vehicle and to charge a battery 132 installed on the vehicle.

Figure 24:
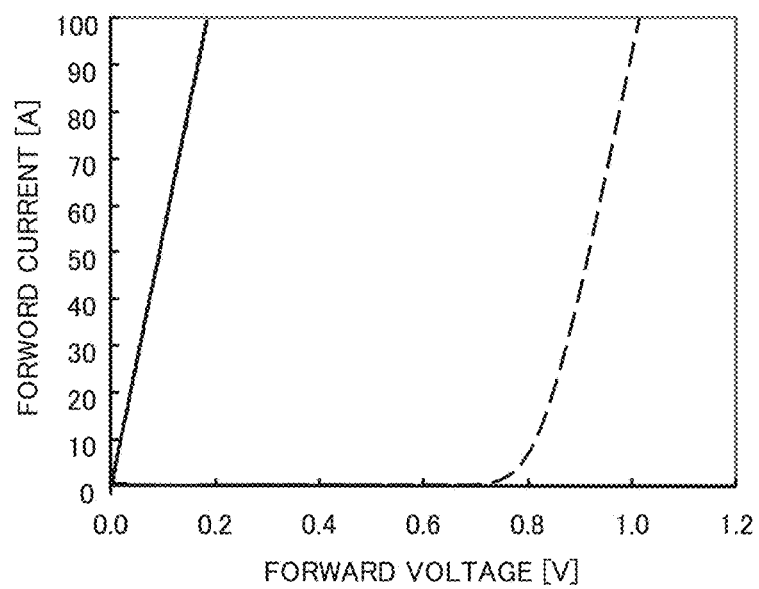
FIG. 24 is a diagram illustrating the current-voltage characteristics of a MOSFET rectifier according to the present invention and those of a conventional diode rectifier.

FIG. 24 is a diagram illustrating the forward current-voltage characteristics of synchronous rectification MOSFET rectifiers S1 and S2 according to the present invention (represented by a solid line in FIG. 24) and that of a conventional diode rectifier (represented by a dashed line in FIG. 24) for a comparison. The conventional diode rectifier here uses a P-N junction diode. The presented current-voltage characteristics are characteristics measured at room temperature.

The current-voltage characteristics of a diode are such that a forward current starts to flow when a voltage of 0.7 to 0.8 V or more is applied across the diode. This is because a diode has a built-in potential. Application of a voltage corresponding to the built-in potential cause the diode to flow a forward current. In contrast, each of the current-voltage characteristics of synchronous rectification MOSFET rectifiers S1 and S2 according to the first and second embodiments (present invention) is such that a current starts to flow when a voltage of 0 V or more is applied across the rectifier. This is because a MOSFET has no built-in potential. By virtue of this characteristics of the MOSFET, it is possible to flow a large current with a low voltage and thus significantly reduce the loss occurring in a rectification operation.

According to the above-described embodiments, each of the packages of the rectifiers S1 and S2 is formed with the corresponding base electrode 101, the external shape of which is circular in top plan view. The circular packages of the rectifiers S1 and S2 are respectively fixed to the heat dissipation plates 119a and 119b of the electrode plates of the alternator Ot. The use of the package having a circular shape allows to carry out center alignment of the base electrode 101 in fixing the rectifier S1 and S2 respectively to the heat dissipation plates 119a and 119b of electrode plates of the alternator Ot, without positioning the base electrode 101 in a rotational direction around a rotation axis of the base electrode 101 (center axis O). This makes it easy to assemble an rectification apparatus Os of the alternator Ot.

This makes it possible to provide MOSFET rectifiers S1 and S2, which have a small loss and which are simply fixed to an alternator Ot. In particular, it allows simple assembly of the rectifiers and the rectifiers are simply fixed to the alternator Ot by press-in.

Since the rectifiers S1 and S2 are easily fixed to the alternator Ot, it is possible to simplify the assembly process of the alternator Ot and thus reduce costs.

OTHER EMBODIMENTS

1. The base electrodes 101 of the first and second embodiments are each exemplified to have an outer peripheral section 101s having a circular cylindrical shape, which has a circular shape in top plan view. However, the base electrode 101 may have an outer peripheral section 101s having a sphere shape with a circular curvature, which has a circular shape in top plan view, for example.

2. Instead of the recess 124 shown in FIG. 15, a positioning projection may be formed on the outer peripheral section 101s or a bottom surface of the base electrode 101, and a recess into which the positioning projection is fitted may be formed on an external side to which the base electrode 101 is set. The positioning of each of the rectifiers S1 (S11, S12) and S2 is established by fitting the positioning projection of the base electrode 101 of the rectifier into the recess of the external side.

3. In the second embodiment, the rectifiers S1, S2 and the rectification apparatus Os are used for an alternator Ot as an example. However, they may be used in a power conversion device. Use of the rectifiers S1, S2 and the rectification apparatus Os for a power conversion device produces the same effects as those described above.

4. The present invention is not limited to the above described embodiments, but includes various variations. For example, the above-described embodiments have only been described in detail for a better understanding of the invention and are therefore not necessarily limited to a configuration containing all the described constituent elements. For example, an embodiment of the invention may partially include the described constituent elements. In addition, a part of the configuration of a certain embodiment may be replaced with the configuration of another embodiment, and the configuration of a certain embodiment may be modified by adding a configuration of another embodiment.

Further, a portion of the configuration in each of the embodiments may be modified by adding other configuration, by deletion, or by replacing with other configuration. For example, rectifiers appropriately selected from the described rectifiers S1, S11, S12, and S2 may be combined to configure a rectification apparatus.

REFERENCE SIGNS LIST

101 Base electrode (first external electrode, second external electrode)
101s Outer peripheral section
102 Pedestal (part of first external electrode)
103 MOSFET chip
103d Drain electrode (first main terminal)
103g Gate electrode (gate)
103s Source electrode (second main terminal)
104 Control circuit chip (control circuitry)
104a First electrode (electrode)
104b Second electrode (electrode)
104c Third electrode (electrode)
104d Fourth electrode (electrode)
105 Capacitor
106 Isolation substrate
107 Lead electrode (second external electrode, first external electrode)
107d Pedestal
108 Resin (first resin)
109 Solder
112, 113 Electrode
115 Wire
121 Zener diode
122 Notch (recess)
123 Orientation flat (recess)
124 Recess
125 Copper wire or copper plate (conductor)
146A, 146B, 148A, 148B Pin with spring (Conduction mechanism)
146b1, 146b2, 148b, 148b2 Spring
O Center axis (center line of outer peripheral section)
Os Rectification apparatus
Ot Alternator (power conversion device)
S1 Forward-side rectifier (semiconductor device)
S2 Reverse-side rectifier (semiconductor device)

The invention claimed is:
1. A semiconductor device comprising:
a first external electrode to be attached to an alternator, the first external electrode having an outer peripheral section, which has a circular shape in top plan view;
a MOSFET chip;
a second external electrode disposed on one side of the MOSFET chip, on the other side of which the first external electrode is disposed;
a control circuitry to which a voltage at a drain electrode of the MOSFET chip and a voltage at a source electrode of the MOSFET chip are inputted or a current flowing between the drain electrode of the MOSFET chip and the source electrode of the MOSFET chip is inputted, the control circuitry generating a control signal provided to a gate of the MOSFET chip on the basis of the voltages or the current; and
a capacitor that supplies electric power to the control circuitry,
wherein the MOSFET chip and the control circuitry are mounted on the first external electrode,
wherein the first external electrode, the drain electrode of the MOSFET chip, the source electrode of the MOSFET chip, and the second external electrode are disposed so as to be stacked in this order in an upward direction,
wherein the drain electrode of the MOSFET chip and the first external electrode are electrically connected with each other,
wherein the source electrode of the MOSFET chip and the second external electrode are electrically connected with each other, and
wherein the capacitor is mounted on the first external electrode via an isolation substrate.

2. The semiconductor device set forth in claim 1, wherein the circular outer peripheral section or a bottom surface of the first external electrode has a recess or a projection for positioning the circular outer peripheral section in a rotational direction around a center line of the circular outer peripheral section.

3. The semiconductor device set forth in claim 1, wherein the MOSFET chip and the second external electrode are positioned on a center line of the circular outer peripheral section.

4. The semiconductor device set forth in claim 1, wherein an extended surface of the drain electrode of the MOSFET chip and an extended surface of the first external electrode are coupled with each other through solder or by press-fitting and an extended surface of the source electrode of the MOSFET chip and an extended surface of the second external electrode are connected with each other through solder or by press-fitting.

5. The semiconductor device set forth in claim 1, wherein the MOSFET chip and the control circuitry are electrically connected with each other by a wire and the control circuitry and the capacitor are electrically connected with each other by a wire.

6. The semiconductor device set forth in claim 1, wherein an electrical connection by a conductor or a conduction mechanism having a spring is made between the MOSFET chip and the control circuitry and between the control circuitry and the capacitor, the conductor or the conduction mechanism each having formed with a shape enabling respective connections, wherein the conductor is fixed to electrodes via solder, and wherein the conduction mechanism is fixed to electrodes by being pressed with an elastic force of the spring.

7. The semiconductor device set forth in claim 1, wherein the MOSFET chip has a rectangular shape, and wherein the capacitor and the control circuitry are disposed alongside and adjacent to a longitudinal side of the rectangular shape.

8. The semiconductor device set forth in claim 1, wherein the semiconductor device further comprises a zener diode,
wherein the zener diode has a first main terminal electrically connected to the first external electrode and an extended surface of the first main terminal is coupled to an extended surface of the first external electrode,
wherein the zener diode has a second main terminal electrically connected to the second external electrode and an extended surface of the second main terminal is coupled to an extended surface of the second external electrode.

9. The semiconductor device set forth in claim 1, wherein a zener diode is incorporated in the MOSFET chip.

10. The semiconductor device set forth in claim 1, wherein the first external electrode has a pedestal having an extent within the circular outer peripheral section, wherein the MOSFET chip, the control circuitry, and the capacitor are mounted on the pedestal of the first external electrode, wherein the pedestal of the first external electrode, the MOSFET chip, the control circuitry, and the capacitor are encapsulated by a first resin.

11. The semiconductor device set forth in claim 1, wherein the first external electrode has a pedestal having an extent within the circular outer peripheral section, wherein the MOSFET chip, the control circuitry, and the capacitor are mounted on the pedestal of the first external electrode, wherein the pedestal of the first external electrode, the MOSFET chip, the control circuitry, and the capacitor are encapsulated by a first resin, wherein, in the first resin, side walls of the MOSFET chip and side walls of a semiconductor chip of the control circuitry are covered with a second resin, and wherein the second resin has a higher adhesion with the MOSFET chip and the semiconductor chip of the control circuitry than the first resin.

12. A semiconductor device comprising:

a first external electrode to be attached to an alternator, the first external electrode having an outer peripheral section, which has a circular shape in top plan view;

a MOSFET chip;

a second external electrode disposed on one side of the MOSFET chip, on the other side of which the first external electrode is disposed;

a control circuitry to which a voltage at a drain electrode of the MOSFET chip and a voltage at a source electrode of the MOSFET chip are inputted or a current flowing between the drain electrode of the MOSFET chip and the source electrode of the MOSFET chip is inputted, the control circuitry generating a control signal provided to a gate of the MOSFET chip on the basis of the voltages or the current; and a capacitor that supplies electric power to the control circuitry, wherein the second external electrode has a pedestal having an extent within the circular outer peripheral section of the first external electrode, wherein the MOSFET chip and the control circuitry are mounted on the pedestal of the second external electrode, wherein the second external electrode, the drain electrode of the MOSFET chip, the source electrode of the MOSFET chip, and the first external electrode are disposed so as to be stacked in this order in an upward direction, wherein the drain electrode of the MOSFET chip and the second external electrode are electrically connected with each other, wherein the source electrode of the MOSFET chip and the first external electrode are electrically connected with each other, and wherein the capacitor is mounted on the pedestal of the second external electrode via an isolation substrate.

13. The semiconductor device set forth in claim 12, wherein the circular outer peripheral section or a bottom surface of the first external electrode has a recess or a projection for positioning the circular outer peripheral section in a rotational direction around a center line of the circular outer peripheral section.

14. The semiconductor device set forth in claim 12, wherein an extended surface of the drain electrode of the MOSFET chip and an extended surface of the second external electrode are coupled with each other through solder or by press-fitting and an extended surface of the source electrode of the MOSFET chip and an extended surface of the first external electrode is coupled with each other through solder or by press-fitting.

15. The semiconductor device set forth in claim 12, wherein the first external electrode has a pedestal having an extent within the circular outer peripheral section, wherein the pedestal of the first external electrode, the pedestal of the second external electrode, the MOSFET chip, the control circuitry, and the capacitor are encapsulated by a first resin.

16. An alternator comprising a semiconductor device set forth in claim 1.

17. An alternator comprising a rectification circuit, the rectification circuit comprising:

a high-side circuit in which a first semiconductor device is incorporated as a rectification device; and a low-side circuit in which a second semiconductor device is incorporated as a rectification device, wherein both of the first semiconductor device and the second semiconductor device comprise:

a first external electrode to be attached to an alternator, the first external electrode having an outer peripheral section, which has a circular shape in top plan view;

a MOSFET chip;

a second external electrode disposed on one side of the MOSFET chip, on the other side of which the first external electrode is disposed;

a control circuitry to which a voltage at a drain electrode of the MOSFET chip and a voltage at a source electrode of the MOSFET chip are inputted or a current flowing between the drain electrode of the MOSFET chip and the source electrode of the MOSFET chip is inputted, the control circuitry generating a control signal provided to a gate of the MOSFET chip on the basis of the voltages or the current; and a capacitor that supplies electric power to the control circuitry, wherein the MOSFET chip of the first semiconductor device and the control circuitry of the first semiconductor device are mounted on the first external electrode of the first semiconductor device, wherein the first external electrode of the first semiconductor device, the drain electrode of the MOSFET chip of the first semiconductor device, the source electrode of the MOSFET chip of the first semiconductor device, and the second external electrode of the first semiconductor device are disposed so as to be stacked in this order in an upward direction, wherein the drain electrode of the MOSFET chip of the first semiconductor device and the first external electrode of the first semiconductor device are electrically connected with each other, wherein the source electrode of the MOSFET chip of the first semiconductor device and the second external electrode of the first semiconductor device are electrically connected with each other, wherein the capacitor of the first semiconductor device is mounted on the first external electrode of the first semiconductor device via a first isolation substrate, wherein the second external electrode of the second semiconductor device has a pedestal having an extent within the circular outer peripheral section of the first external electrode of the second semiconductor device, wherein the MOSFET chip of the second semiconductor device and the control circuitry of the second semiconductor device are mounted on the pedestal of the second external electrode of the second semiconductor device, wherein the second external electrode of the second semiconductor device, the drain electrode of the MOSFET chip of the second semiconductor device, the source electrode of the MOSFET chip of the second semiconductor device, and the first external electrode of the second semiconductor device are disposed so as to be stacked in this order in an upward direction, wherein the drain electrode of the MOSFET chip of the second semiconductor device and the second external electrode of the second semiconductor device are electrically connected with each other, wherein the source electrode of the MOSFET chip of the second semiconductor device and the first external electrode of the second semiconductor device are electrically connected with each other, and wherein the capacitor of the second semiconductor device is mounted on the pedestal of the second external electrode of the second semiconductor device via a second isolation substrate.

18. An electric power conversion device comprising a semiconductor device set forth in claim 1.

* * * * *